United States Patent
Granger-Jones

(10) Patent No.: US 9,100,046 B2
(45) Date of Patent: Aug. 4, 2015

(54) DIGITAL STEP ATTENUATOR UTILIZING THERMOMETER ENCODED MULTI-BIT ATTENUATOR STAGES

(75) Inventor: Marcus Granger-Jones, Scotts Valley, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 421 days.

(21) Appl. No.: 13/589,037

(22) Filed: Aug. 17, 2012

(65) Prior Publication Data
US 2013/0043962 A1   Feb. 21, 2013

Related U.S. Application Data

(60) Provisional application No. 61/524,415, filed on Aug. 17, 2011.

(51) Int. Cl.
 *H01P 1/22* (2006.01)
 *H03M 1/68* (2006.01)
 *H03M 1/80* (2006.01)

(52) U.S. Cl.
 CPC .............. *H03M 1/682* (2013.01); *H01P 1/22* (2013.01); *H03M 1/806* (2013.01); *H03M 1/808* (2013.01)

(58) Field of Classification Search
 CPC ........................................................ H01P 1/22
 USPC ................ 333/81 A, 81 R; 327/308, 309
 See application file for complete search history.

(56) References Cited

U.S. PATENT DOCUMENTS

2010/0164656 A1*   7/2010   Chiu ..................... 333/81 R

OTHER PUBLICATIONS

Krafcsik, D. et al., "Broadband, low-loss 5- and 6-bit digital attenuators," Microwave Symposium Digest, vol. 3, 1995, pp. 1627-1630.
Baker, R., "CMOS-based digital step attenuator designs," Wireless Design and Development, 2004, 4 pages.
Ku, B.H. et al., "6-bit CMOS digital attenuators with low phase variations for X-band phased-array systems," IEEE Transactions on Microwave Theory and Techniques, vol. 58, No. 7, Jul. 2010, pp. 1651-1663.
Min, B.W. et al., "A 10-50-GHz CMOS distributed step attenuator with low loss and low phase imbalance," IEEE Journal of Solid-State Circuits, vol. 42, No. 11, Nov. 2007, pp. 2547-2554.
Peregrine Semiconductor, "Product Specification: PE43703," copyright 2008, 15 pages.

* cited by examiner

*Primary Examiner* — Stephen E Jones
(74) *Attorney, Agent, or Firm* — Withrow & Terranova, P.L.L.C.

(57) ABSTRACT

A digital step attenuator with thermometer encoded attenuator stages is disclosed. In one embodiment, Embodiments disclosed in the detailed description may include a digital step attenuator, programmable thermometer encoded attenuator stages, the digital step attenuator may include a cascade of programmable thermometer encoded attenuator stages. Each stage may be provided by a programmable impedance array including a plurality of impedances arranged in parallel. The impedance of each of the plurality of each stage may change monotonically by switchably inserting or removing one of the plurality of impedances in the arrays. The control circuit may govern the attenuation level of each of the thermometer encoded accumulator stages as a function of a thermometric codeword, which controls the switches in the arrays.

40 Claims, 22 Drawing Sheets

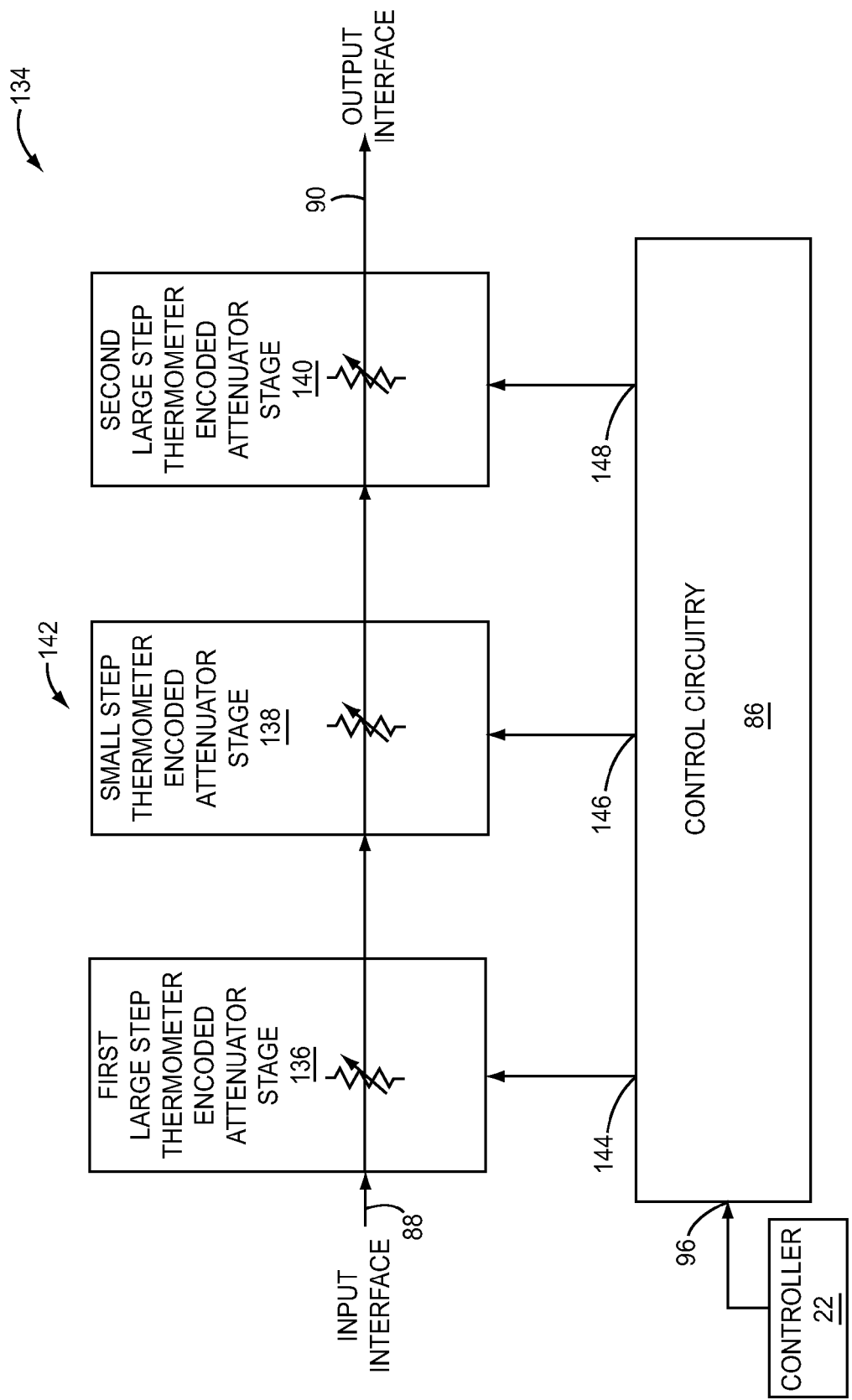

DIGITAL STEP ATTENUATOR UTILIZING THERMOMETER ENCODED MULTI-BIT ATTENUATOR STAGES

PRIORITY CLAIM

The present application claims priority to U.S. Patent Application Ser. No. 61/524,415 filed on Aug. 17, 2011 and entitled "Digital Step Attenuator Utilizing Thermometer Encoded Multi-Bit Attenuator Stages," which is incorporated herein by reference in its entirety.

BACKGROUND

I. Field of the Disclosure

The disclosure relates generally to adjustable attenuators. More specifically, the disclosure relates to digital step attenuators.

II. Background

A communication system may include various types of attenuators to control the signal strength of a signal applied to a particular portion of the communications system. As an example, an attenuator may be used to reduce the power or amplitude of a signal applied to an input of test equipment, gain/attenuator controlling elements, and automatic leveling/power control subsystems. Attenuators may protect receiving devices and match impedances. For example, adjustable attenuators may be used to lower the amplitude of a signal to a known amount to enable measurements or protect a receiving device from damage. In some applications, an attenuator may be used to match impedances by lowering an apparent standing wave ratio (SWR).

In current designs, a number of binary weighted switchable attenuator stages are cascaded in series to create a digital step attenuator. Each binary weighted switchable attenuator stage has just two states. For example, a binary weighted switchable attenuator stage may switch between 0 dB and 1 dB or 0 dB and 2 dB or 0 dB and 4 dB. As a result, each bit of control may add to the insertion loss of the binary weighted switchable attenuator stage based digital step attenuator. Gain stage accuracy during transitions between control words may limit the attenuator step accuracy of the binary weighted switchable attenuator stage based digital step attenuator.

Accordingly, there is a need for an improved digital step attenuator architecture having reduced insertion loss and improved attenuator gain step accuracy.

SUMMARY OF THE DISCLOSURE

Embodiments disclosed in the detailed description may include a digital step attenuator, programmable thermometer encoded attenuator stages, and techniques for providing improved attenuator gain step accuracy and frequency response characteristics. The digital step attenuator may include a cascade of programmable thermometer encoded attenuator stages and a control circuit. The cascade of programmable thermometer encoded accumulator stages may include one or more programmable thermometer encoded attenuator stages having a first attenuation step size and a second programmable thermometer encoded attenuator stage having a second attenuation step size. The first attenuation step size may be substantially equal to a maximum attenuation level of the second programmable thermometer encoded attenuator stage. In some embodiments, the second programmable thermometer encoded attenuator stage may include a plurality of programmable impedance arrays. Each of the programmable impedance arrays may include a plurality of impedances arranged in parallel. The impedance of each of the plurality of programmable impedance arrays may change to monotonically adjust the attenuation level of the second programmable thermometer encoded attenuator stage through the attenuation range of the second programmable thermometer encoded attenuator stage. In some embodiments, the impedance of a programmable impedance array may be adjusted by switchably inserting or removing one of the plurality of impedances arranged in parallel. For example, the impedance of the programmable impedance array may be substantially equal to the parallel impedance of each of the plurality of parallel impedances switchably placed in parallel.

The control circuit may receive a codeword to set an attenuation level of the digital step attenuator. The control circuit may govern the attenuation level of each of the thermometer encoded accumulator stages as a function of the codeword. Additionally, the codeword may be a binary codeword. The control circuit may parse the binary codeword to generate one or more thermometric codewords for each of the programmable thermometer encoded accumulator stages. The control circuit may generate respective thermometer codewords as a function of the binary codeword to provide a desired attenuation level for each of the thermometer encoded attenuator stages in the digital step attenuator. In some embodiments, the control circuit may cooperatively generate the thermometer encoded codewords such that the attenuation level of the second programmable thermometer encoded attenuator stage discretely changes by adding or subtracting an impedance and thereby adding or subtracting a discrete attenuation level step.

The architecture has the potential to be capable of a wider bandwidth, lower insertion loss and superior attenuator step accuracy than the classical architecture based on a cascade of binary weighted attenuators. The architecture is particularly suitable to an integrated Digital step attenuator (DSA) implemented in either bulk, SOI or SOS CMOS. A SOI or SOS solution is advantageous because transistor stacking techniques can be used to provide very low distortion while maintaining a wide radio frequency (RF) bandwidths.

The architecture replaces traditional binary weighted attenuator stages (either single bit or multi-bit) with thermometer encoded multi-level attenuator stages. These multi-level attenuator stages are themselves thermometer encoded. In the final design, the design is segmented between LSB stages that provide the fine resolution and MSB stages that provide the majority of the attenuation.

Those skilled in the art will appreciate the scope of the present disclosure and realize additional aspects thereof after reading the following detailed description in association with the accompanying drawings.

BRIEF DESCRIPTION OF THE FIGURES

The accompanying drawing figures incorporated in and forming a part of this specification illustrate several aspects of the disclosure, and together with the description serve to explain the principles of the disclosure.

FIGS. 3A-3E illustrate embodiments of digital step attenuators wherein each digital step attenuator includes multiple programmable large step thermometer encoded attenuator stages (MSB stages) and a programmable small step thermometer encoded attenuator stage (LSB stage).

DETAILED DESCRIPTION

Figure 1:
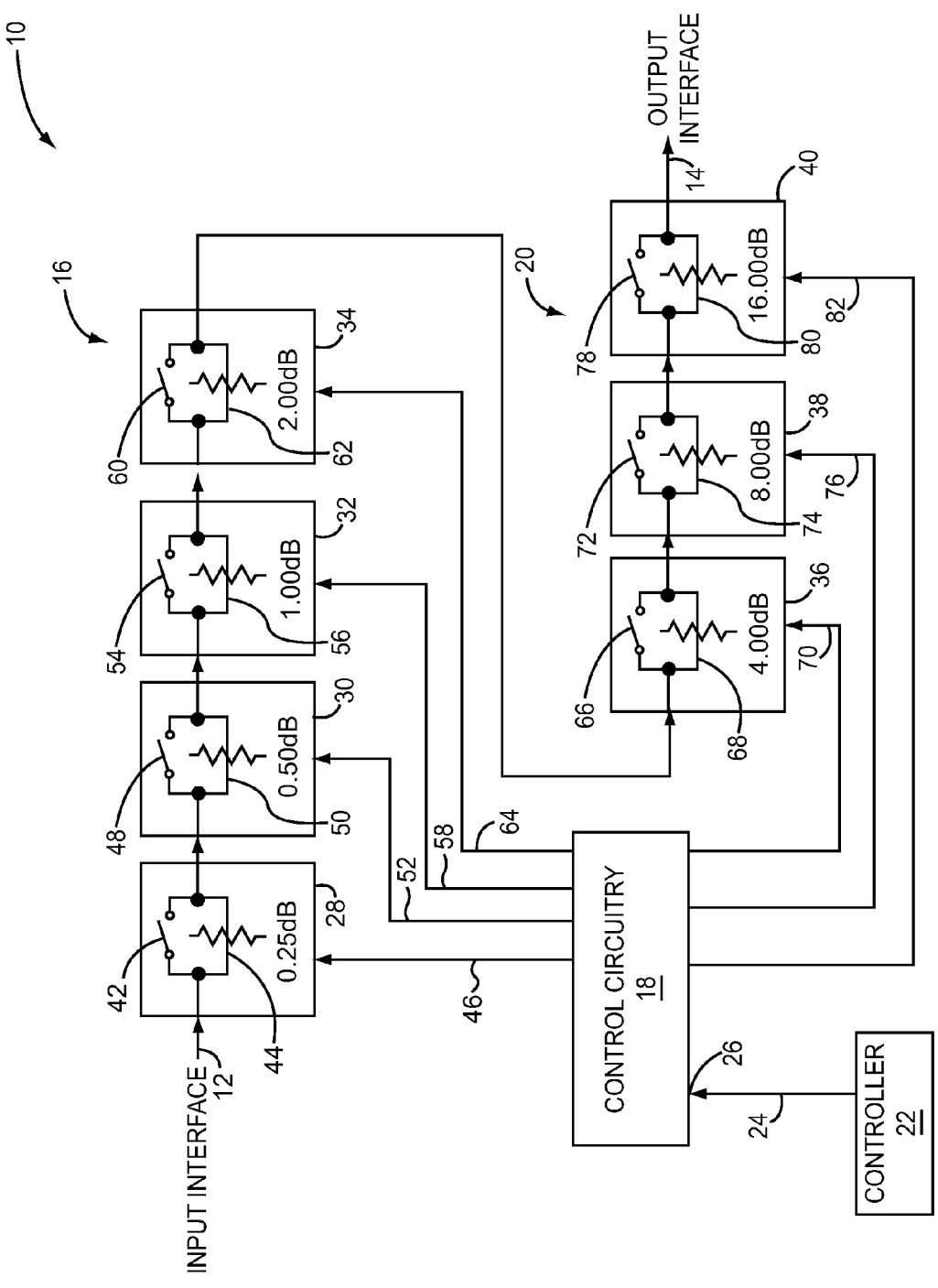
FIG. 1 is a block diagram of related art and illustrates an example binary weighted digital step attenuator including a cascade of binary weighted switchable attenuator stages.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

FIG. 1 depicts an example binary weighted digital step attenuator 10. The example binary weighted digital step attenuator 10 may include an input interface 12, an output interface 14, binary weighted attenuator stages 16, and control circuitry 18. The input interface 12 may receive an input signal, such as a radio frequency (RF) input signal. The binary weighted attenuator stages 16 may be arranged in series to form a cascade of binary weighted switchable attenuator stages 20 between the input interface 12 and the output interface 14. The input signal may pass through the cascade of binary weighted switchable attenuator stages 20 to provide an attenuated output signal at the output interface 14. The controller 22 may set an attenuation level of the binary weighted digital step attenuator 10 as a function of a control word provided to the control circuitry 18. For example, the control word may be a binary control word.

The control circuitry 18 may include a control input 24 to receive the binary control word. The control input 24 may interface with the controller 22 via a control interface 26. In the illustrated example, the binary control word may has seven bits and represents a value in a binary format. Based on the control word, the control circuitry 18 may govern an attenuation level of each of the binary weighted attenuator stages 16.

The cascade of binary weighted switchable attenuator stages 20 may include a first binary weighted attenuator stage 28, a second binary weighted attenuator stage 30, a third binary weighted attenuator stage 32, a fourth binary weighted attenuator stage 34, a fifth binary weighted attenuator stage 36, a sixth binary weighted attenuator stage 38, and a seventh binary weighted attenuator stage 40. Each of the binary weighted attenuator stages 28, 30, 32, 34, 36, 38, 40 has a minimum insertion loss substantially equal to 0.25 dB.

Each of the binary weighted attenuator stages 16 may include a binary weighed attenuator and a bypass switch. The bypass switch may be in parallel with the binary weighted attenuator. By selecting the bypass switches in the binary weighted switchable attenuator stages 16, the attenuation level of the binary weighted digital step attenuator 10 is selected. As an example, the first binary weighted attenuator stage 28 may include a first bypass switch 42 coupled in parallel with a first binary weighted attenuator 44. The first binary weighted attenuator 44 may have a first binary weighted attenuation level substantially equal to 0.25 dB. The control circuitry 18 may provide a first binary control signal 46 to the first binary weighted attenuator stage 28 as a function of the control word to govern the operation of the first bypass switch 42. For example, the control circuitry 18 may close the first bypass switch 42 to set the attenuation level provided by the first binary weighted attenuator stage 28 substantially equal to the insertion loss of 0.25 dB. The controller 22 may open the first bypass switch 42 to set the attenuation level provided by the first binary weighted attenuator stage 28 substantially equal 0.5 dB.

In a similar fashion, each of the second binary weighted attenuator stage 30, the third binary weighted attenuator stage 32, the fourth binary weighted attenuator stage 34, the fifth binary weighted attenuator stage 36, the sixth binary weighted attenuator stage 38, and the seventh binary weighted attenuator stage 40 may have a minimum insertion loss substantially equal to 0.25 dB.

The second binary weighted attenuator stage 30 may include a second bypass switch 48 in parallel with the second binary weighted attenuator 50. The second binary weighted attenuator 50 may have an attenuation level substantially equal to 0.5 dB. The control circuitry 18 may provide a second binary control signal 52 to the second binary weighted attenuator stage 30 as a function of the control word to govern the operation of the second bypass switch 48. The control circuitry 18 may close the second bypass switch 48 to set the attenuation level provided by the second binary weighted attenuator stage 30 which may be substantially equal to the insertion loss of 0.25 dB. The controller 22 may open the second bypass switch 48 to set the attenuation level provided by the second binary weighted attenuator stage 30 substantially equal to 0.75 dB.

The third binary weighted attenuator stage 32 may include a third bypass switch 54 in parallel with the third binary weighted attenuator 56. The third binary weighted attenuator 56 may have an attenuation level substantially equal to 1.00 dB. The control circuitry 18 may provide a third binary control signal 58 to the third binary weighted attenuator stage 32 as a function of the control word to govern the operation of the third bypass switch 54. The control circuitry 18 may close the third bypass switch 54 to set the attenuation level provided by the third binary weighted attenuator stage 32 substantially equal to the insertion loss of 0.25 dB. The controller 22 may open the third bypass switch 54 to set the attenuation level provided by the third binary weighted attenuator stage 32 substantially equal to 1.25 dB.

The fourth binary weighted attenuator stage 34 may include a fourth bypass switch 60 in parallel with the fourth binary weighted attenuator 62. The fourth binary weighted attenuator 62 may have an attenuation level substantially equal to 2.00 dB. The control circuitry 18 may provide a fourth binary control signal 64 to the fourth binary weighted attenuator stage 34 as a function of the control word to govern the operation of the fourth bypass switch 60. The control circuitry 18 may close the fourth bypass switch 60 to set the attenuation level provided by the fourth binary weighted attenuator stage 34 which may be substantially equal to the insertion loss of 0.25 dB. The controller 22 may open the fourth bypass switch 60 to set the attenuation level provided by the fourth binary weighted attenuator stage 34 substantially equal to 2.25 dB.

The fifth binary weighted attenuator stage 36 may include a fifth bypass switch 66 in parallel with the fifth binary weighted attenuator 68. The fifth binary weighted attenuator 68 may have an attenuation level substantially equal to 4.00 dB. The control circuitry 18 may provide a fifth binary control signal 70 to the fifth binary weighted attenuator stage 36 as a function of the control word to govern the operation of the fifth bypass switch 66. The control circuitry 18 may close the fifth bypass switch 66 to set the attenuation level provided by the fifth binary weighted attenuator stage 36 substantially equal to the insertion loss of 0.25 dB. The controller 22 may open the fifth bypass switch 66 to set the attenuation level provided by the fifth binary weighted attenuator stage 36 substantially equal to 4.25 dB.

The sixth binary weighted attenuator stage 38 may include a sixth bypass switch 72 in parallel with the sixth binary weighted attenuator 74. The sixth binary weighted attenuator 74 may have an attenuation level substantially equal to 8.00 dB. The control circuitry 18 may provide a sixth binary control signal 76 to the sixth binary weighted attenuator stage 38 as a function of the control word to govern the operation of the sixth bypass switch 72. The control circuitry 18 may close the sixth bypass switch 72 to set the attenuation level provided by the sixth binary weighted attenuator stage 38 substantially equal to the insertion loss of 0.25 dB. The controller 22 may open the sixth bypass switch 72 to set the attenuation level provided by the sixth binary weighted attenuator stage 38 substantially equal to 8.25 dB.

The seventh binary weighted attenuator stage 40 may include a seventh bypass switch 78 in parallel with the seventh binary weighted attenuator 80. The seventh binary weighted attenuator 80 may have an attenuation level substantially equal to 16.00 dB. The control circuitry 18 may provide a seventh binary control signal 82 to the seventh binary weighted attenuator stage 40 as a function of the control word to govern the operation of the seventh bypass switch 78. The control circuitry 18 may close the seventh bypass switch 78 to set the attenuation level provided by the seventh binary weighted attenuator stage 40 which may be substantially equal to the insertion loss of 0.25 dB. The controller 22 may open the seventh bypass switch 78 to set the attenuation level provided by the seventh binary weighted attenuator stage 40 substantially equal to 16.25 dB.

Accordingly, the full scale range of the binary weighted digital step attenuator 10 may and attenuation range substantially equal 33.5 dB to 1.75 dB. The control circuitry 18 may selectively control the switch of each of the binary weighted attenuator stages 16 to insert or bypass the respective binary weighted attenuation of each of the binary weighted attenuator stages 16 as a function of the control word. Unfortunately, the problem with this configuration is that each of the each of the binary weighted attenuator stages 28, 30, 32, 34, 36, 38, 40 can only provide two attenuation level values. This thus requires the continual switching of various numbers of the binary weighted attenuator stages 28, 30, 32, 34, 36, 38, 40 to provide any specific value. For example, if the binary codeword is "0111111," the binary codeword may represent the attenuation level 17.5 dB. Accordingly, each of the bypass switches 42, 48, 54, 60, 66, and 72 are closed while the seventh bypass switch 78 is open. The binary code word for 17.75 dB is "1000000." This is simply an increment in the attenuation level by 0.25 dB. However, this requires that the bypass switches 42, 48, 54, 60, 66, and 72 all become open while the seventh bypass switch 78 is closed. The operation of so many of the binary weighted attenuator stages 28, 30, 32, 34, 36, 38, 40 introduces distortion and significantly affects linearity.

Figure 2:
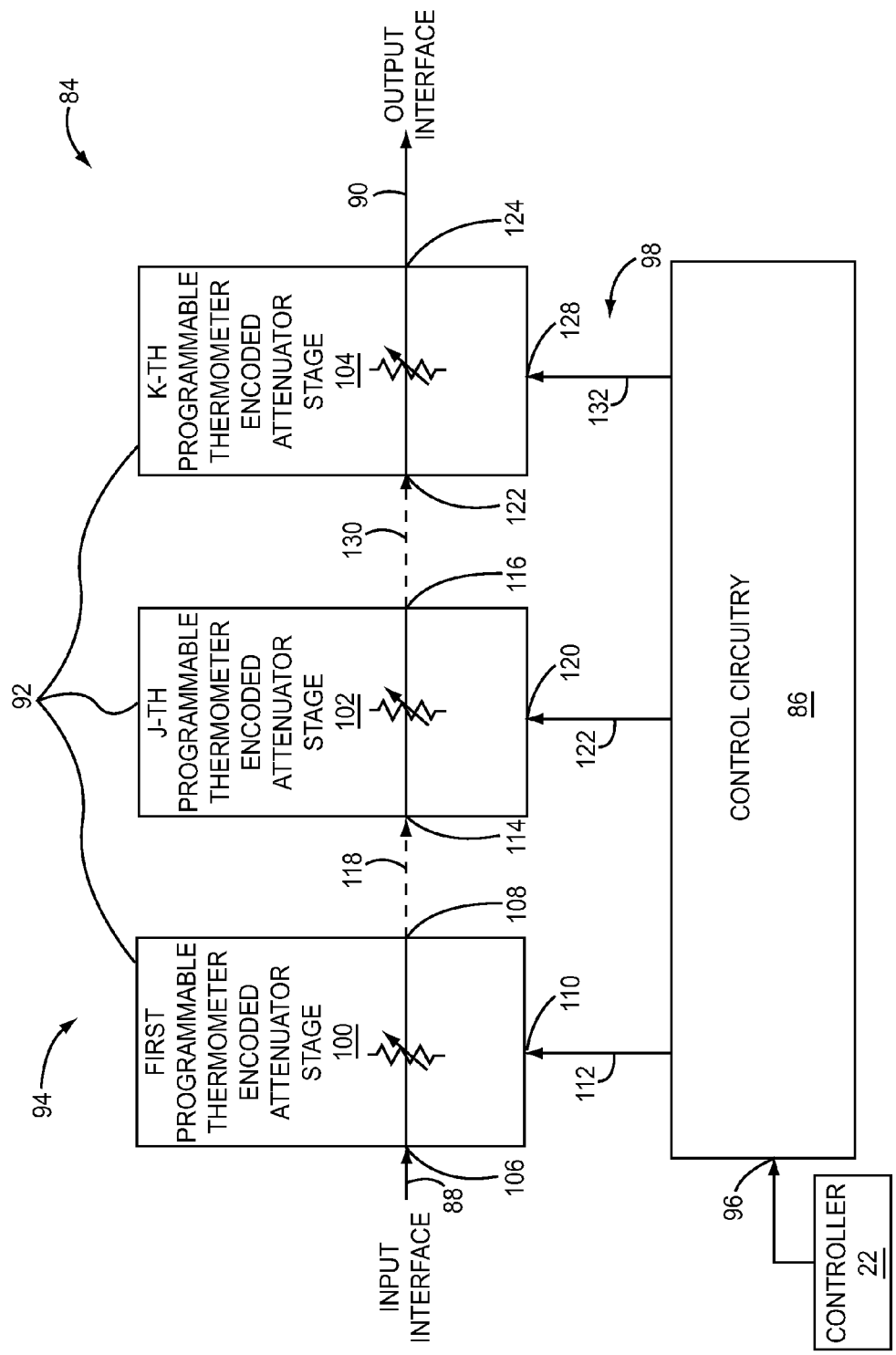
FIG. 2 illustrates one embodiment of a digital step attenuator having multiple programmable thermometer encoded attenuator stages.

FIG. 2 depicts a digital step attenuator 84 including control circuitry 86, an input interface 88, an output interface 90, and programmable thermometer encoded attenuator stages 92. The digital step attenuator 84 operates less of the programmable thermometer encoded attenuator stages 92 to increment or decrement by an attenuation level step. The programmable thermometer encoded attenuator stages 92 may be communicatively arranged in series to form a cascade of programmable thermometer encoded attenuator stages 94 between the input interface 88 and the output interface 90.

The input interface 88 may receive an input signal. For example, the input signal may be a RF input signal. The output interface 90 may provide an attenuated RF output signal. The cascade of programmable thermometer encoded attenuator stages 94 may attenuate the input signal by an attenuation level to provide the attenuated RF output signal. In some embodiments, the RF input signal may be a differential RF input signal. In other embodiments, the output signal may a differential RF output signal.

In some embodiments, the input interface 88 may be a differential input. In other embodiments, the output interface 90 may be a differential output. For example, the cascade of programmable thermometer encoded attenuator stages 94 may include programmable thermometer encoded attenuator stages 92 that have a balance attenuator circuit topology. As an example, a balanced attenuator circuit topology may include a differential attenuator circuit topology configured to attenuate a differential signal. In some embodiments, the cascade of programmable thermometer encoded attenuator stages 94 may each have a balanced attenuator circuit topology.

Alternatively, in other embodiments, only a portion of the programmable thermometer encoded attenuator stages 92 may each have a balanced attenuator circuit topology. For example, in some embodiments of the cascade of programmable thermometer encoded attenuator stages 94, the digital step attenuator 84 may transform a differential signal into a single-ended signal. For example, the input interface 88 may receive a differential input signal and the output interface 90 may provide a single-ended output signal. As an alternative example, the input interface 88 may receive a single-ended input signal and the output interface 90 may provide a differential output signal.

In other embodiments, the input interface 88 may be a single-ended input. In other embodiments, the output interface 90 may be a single-ended output. For example, the cascade of programmable thermometer encoded attenuator stages 94 may include programmable thermometer encoded attenuator stages that have only a single ended circuit topology.

The control circuitry 86 may include a control interface 96 in communication with a controller 22. The controller 22 may govern the attenuation level of the digital step attenuator 84 by providing a control word to the control circuitry 86 via a control interface 96. In some embodiments, the control interface 96 may include a control bus. For example, the control interface 96 may include a serial control bus coupled between the control circuitry 86 and the controller 22. In other embodiments, the control interface may include a parallel control bus. The control interface may permit the controller 22 to write a control word to the control circuitry 86 to govern the attenuation level through the digital step attenuator 84.

As an example, the control word may be a codeword. In some embodiments, the control word may be a binary codeword. As an example, the control circuitry 86 may decode the control word to generate thermometer encoded control signals 98. The control circuitry 86 may provide the thermometer encoded control signals 98 to the cascade of programmable thermometer encoded attenuator stages 94. For example, the control circuitry 86 may provide each of the programmable thermometer encoded attenuator stages 92 a respective thermometer encoded codeword to set the attenuation level for each of the programmable thermometer encoded attenuator stages 92.

As an example, the controller 22 may provide a binary codeword as the control word to the control circuitry 86. Based on the binary codeword, the control circuit may generate each respective thermometeric encoded codeword. To govern the digital step attenuator 84 through a full range of attenuation values, the control circuitry 86 may govern the attenuation level for each of the programmable thermometer encoded attenuator stages 92 as a function of the control word provided by the controller 22. The control circuitry 86 may decode the binary codeword received from the controller 22 to provide each of the programmable thermometer encoded attenuator stages 92 a respective thermometer encoded codeword to cooperatively generate thermometer encoded attenuation levels between the input interface 88 and the output interface 90.

The control circuitry 86 may generate the respective thermometer encoded codeword to adjust the respective attenuation level of each of the programmable thermometer encoded attenuator stages 92 in a particular order to maximize the linearity of a signal response through the cascade of programmable thermometer encoded attenuator stages 94. As another example, the control circuitry 86 may selectively adjust the respective attenuation level of each of the programmable thermometer encoded attenuator stages 92 in a particular order to maximize a signal to noise characteristic of the digital step attenuator 84. As still another example, the control circuitry 86 may selectively adjust the respective attenuation level of each of the programmable thermometer encoded attenuator stages 92 in a particular order to based on a location of each of the programmable thermometer encoded attenuator stages 92 in the cascade of programmable thermometer encoded attenuator stages 94. For example, the control circuitry 86 may adjust an attenuation level of at least some of the programmable thermometer encoded attenuator stages 92 in cascade order.

As an example, FIG. 2 depicts a cascade of programmable thermometer encoded attenuator stages 94 that may include "K" programmable thermometer encoded attenuator stages. As an example, the cascade of programmable thermometer encoded attenuator stages 94 may include a first programmable thermometer encoded attenuator stage 100, a j-th programmable thermometer encoded attenuator stage 102, and a k-th programmable thermometer encoded attenuator stage 104. The first programmable thermometer encoded attenuator stage 100, the j-th programmable thermometer encoded attenuator stage 102, and the k-th programmable thermometer encoded attenuator stage 104 may be in serial communication to form the cascade of programmable thermometer encoded attenuator stages 94. Based on the control word, the control circuitry 86 may generate a first thermometer encoded control word to set a first attenuation level of the first programmable thermometer encoded attenuator stage 100, a j-th thermometer encoded control word to set a j-th attenuation level of the j-th programmable thermometer encoded attenuator stage 102, and a k-th thermometer encoded control word to set a k-th attenuation level of the k-th programmable thermometer encoded attenuator stage 104.

The first programmable thermometer encoded attenuator stage 100 may include a first attenuator input 106, a first attenuator output 108, and a first attenuator control input 110. The first attenuator control input 110 may receive a first thermometer encoded control signals 112 from the control circuitry 86. The first thermometer encoded control signals 112 may provide the first thermometer encoded control word to the first programmable thermometer encoded attenuator stage 100 as a function of the control word. The first programmable thermometer encoded attenuator stage 100 may have a first attenuation step size, a first full scale attenuation range, and a first insertion loss. The first attenuation loss of the first programmable thermometer encoded attenuator stage 100 may substantially equal the first insertion loss plus a first programmable attenuation level. The first programmable attenuation level may be a function of the first attenuation step size and the first thermometer encoded control word. The first maximum attenuation level of the first programmable thermometer encoded attenuator stage 100 may substantially equal the first insertion loss plus the first full scale attenuation range. The first minimum attenuation level of the first programmable thermometer encoded attenuator stage 100 may be substantially equal to the insertion loss of the first programmable thermometer encoded attenuator stage 100.

The j-th programmable thermometer encoded attenuator stage 102 may include a j-th attenuator input 114, a j-th attenuator output 116, and a j-th attenuator control input 118. The j-th attenuator input 114 may be in communication with the first attenuator output 108. The j-th attenuator input 114 may receive a j-th input signal 120. The j-th input signal 120 may have a magnitude substantially equal to a magnitude of the input signal received at the input interface 88 less the sum of the attenuation levels of the ones of the programmable thermometer encoded attenuator stages 92 that precede the j-th programmable thermometer encoded attenuator stage 102.

The j-th attenuator control input 118 may receive a j-th thermometer encoded control signals 122 from the control circuitry 86. The j-th thermometer encoded control signals 122 may provide the j-th thermometer encoded control word to the j-th programmable thermometer encoded attenuator stage 102 as a function of the control word. The j-th programmable thermometer encoded attenuator stage 102 may have a j-th attenuation step size, a j-th full scale attenuation range, and a j-th insertion loss. The j-th attenuation loss of the j-th programmable thermometer encoded attenuator stage 102 may substantially equal the j-th insertion loss plus a j-th programmable attenuation level. The j-th programmable attenuation level may be a function of the j-th attenuation step size and the j-th thermometer encoded control word. The j-th maximum attenuation level of the j-th programmable thermometer encoded attenuator stage 102 may substantially equal the j-th insertion loss plus the j-th full scale attenuation range.

The k-th programmable thermometer encoded attenuator stage 104 may include a k-th attenuator input 124, a k-th attenuator output 126, and a k-th attenuator control input 128. The k-th attenuator input 124 may be in communication with the j-th attenuator output 116. The k-th attenuator input 124 may receive a k-th input signal 130 that has a magnitude substantially equal to a magnitude of the input signal received at the input interface 88 less the sum of the attenuation levels of the ones of the programmable thermometer encoded attenuator stages 92 that precede the j-th programmable thermometer encoded attenuator stage 102.

The k-th attenuator control input 128 may receive a k-th thermometer encoded control signals 132 from the control circuitry 86. The k-th thermometer encoded control signals 132 may provide the k-th thermometer encoded control word to the k-th programmable thermometer encoded attenuator stage 104 as a function of the control word. The k-th programmable thermometer encoded attenuator stage 104 may have a k-th attenuation step size, a k-th full scale attenuation range, and a k-th insertion loss. The k-th attenuation loss of the k-th programmable thermometer encoded attenuator stage 104 may substantially equal the k-th insertion loss plus a k-th programmable attenuation level. The k-th programmable attenuation level may be a function of the k-th attenuation step size and the k-th thermometer encoded control word. The k-th maximum attenuation level of the k-th programmable thermometer encoded attenuator stage 104 may substantially equal the k-th insertion loss plus the k-th full scale attenuation range.

As a non-limiting example embodiment, the digital step attenuator 84 may provide substantial monotonicity of attenuation as a function of a relationship between the j-th maximum attenuation level of the j-th programmable thermometer encoded attenuator stage 102 with respect to the first attenuation level step size.

In some embodiments of the digital step attenuator 84, the j-th insertion loss may substantially equal the first insertion loss. The j-th maximum attenuation level of the j-th programmable thermometer encoded attenuator stage 102 may substantially equal the first attenuation step size of the first programmable thermometer encoded attenuator stage 100. In addition, in some embodiments, the k-th insertion loss may be substantially equal to the first insertion loss. Also, the k-th attenuation step size of the k-th programmable thermometer encoded attenuator stage 104 may substantially equal the first attenuation level step size of the first programmable thermometer encoded attenuator stage 100.

As an example embodiment, the j-th programmable thermometer encoded attenuator stage 102 may have a j-th attenuation step size and a j-th full scale attenuation range. The sum of the j-th attenuation full scale attenuation range plus the insertion loss of the j-th programmable thermometer encoded attenuator stage 102 may provide a j-th maximum attenuation level substantially equal to the first attenuation step size. The j-th programmable thermometer encoded attenuator stage 102 may have an insertion loss substantially equal to the insertion loss of the first programmable thermometer encoded attenuator stage 100. The j-th maximum attenuation level may be substantially equal to a sum of an insertion loss of the j-th programmable thermometer encoded attenuator stage 102 and the maximum full scale attenuation range of the of the j-th programmable thermometer encoded attenuator stage 102.

The controller 22 may monotonically adjust the attenuation level provided by the digital step attenuator 84 may by stepping the attenuation level of the j-th programmable thermometer encoded attenuator stage 102 through the j-th full scale attenuation range. The controller 22 may then step the attenuation level of the first programmable thermometer encoded attenuator stage 100 and set the attenuation level of j-th programmable thermometer encoded attenuator stage 102 substantially equal to either the insertion loss or the j-th maximum attenuation level such that the attenuation level of the digital step attenuation changes by the j-th attenuation step size.

For example, in some embodiments, the j-th attenuation step size may be substantially equal to 0.25 dB. The insertion loss of the j-th programmable thermometer encoded attenuator stage 102 may be substantially equal to 0.25 dB. The j-th maximum attenuation level may substantially equal 2 dB. Thus, controller 22 may configure the j-th programmable thermometer encoded attenuator to provide attenuation levels substantially equal to 0.25 dB, 0.5 dB, 0.75 dB, 1.00 dB, 1.25 dB, 1.50 dB, 1.75 dB, and 2.0 dB. The j-th full scale attenuation range may be substantially equal to 1.75 dB.

As a further example, the first attenuation step size may be substantially equal to 2 dB. The first programmable thermometer encoded attenuator stage 100 may have an insertion loss substantially equal to 0.25 dB. The first programmable thermometer encoded attenuator stage 100 have a first full scale attenuation level substantially equal to 16 dB. Thus, controller 22 may configure the first programmable thermometer encoded attenuator to include attenuation levels substantially equal to 0.25 dB, 2.25 dB, 4.25 dB, 6.25 dB, 8.25 dB, 10.25 dB, 12.25 dB, 14.25 dB, and 16.25 dB. Accordingly, the combined insertion loss of the first programmable thermometer encoded attenuator stage 100 and the j-th programmable thermometer encoded attenuator stage 102 is substantially equal to 0.50 dB. The controller 22 may increment the attenuation level of the digital step attenuator 84 by stepping the attenuation level of the j-th programmable thermometer encoded attenuator stage 102 through the j-th full scale attenuation level such that the attenuation level provided by the j-th programmable thermometer encoded attenuator stage 102 is substantially equal to 2 dB. Thereafter, the controller 22 may increment the attenuation level of the first programmable thermometer encoded attenuator stage 100 by 2 dB and set the attenuation level of the j-th programmable thermometer encoded attenuator stage 102 substantially equal to 0.25 dB.

In a similar manner, the controller 22 may decrement the attenuation level of the digital step attenuator 84 by stepping the attenuation level of the j-th programmable thermometer encoded attenuator stage 102 through the j-th full scale attenuation level such that the attenuation level provided by the j-th programmable thermometer encoded attenuator stage 102 is substantially equal to 0.25 dB. Thereafter, the controller 22 may decrement the attenuation level of the first programmable thermometer encoded attenuator stage 100 by 2 dB and set the attenuation level of the j-th programmable thermometer encoded attenuator stage 102 substantially equal to 2.00 dB. Accordingly, the controller 22 may adjust the combined attenuation level of the first programmable thermometer encoded attenuator stage 100 and the j-th programmable thermometer encoded attenuator stage 102 by the j-th attenuation step size between 0.5 dB and 18.25 dB, where the combined insertion loss is substantially equal to 0.5 dB. The composite full scale range of the first programmable thermometer encoded attenuator stage 100 and the j-th programmable thermometer encoded attenuator stage 102 may be substantially equal to 17.75 dB.

The full scale range of the digital step attenuator 84 may be set based on the number of the programmable thermometer encoded attenuators having a step size substantially equal to the first attenuator step size. For example, the k-th programmable thermometer encoded attenuator stage may have a k-th attenuator step size substantially equal to 2 dB, an insertion loss substantially equal to 0.25 dB, and a k-th full scale range substantially equal to 14 dB. Thus, controller 22 may configure the k-th programmable thermometer encoded attenuator to include attenuation levels substantially equal to 0.25 dB, 2.25 dB, 4.25 dB, 6.25 dB, 8.25 dB, 10.25 dB, 12.25 dB, and 14.25 dB. The composite full scale range of the first programmable thermometer encoded attenuator stage 100, the j-th programmable thermometer encoded attenuator stage 102, and the k-th programmable thermometer encoded attenuator stage 104 may be substantially equal to 31.75 dB with a total insertion loss of only 0.75 dB.

As another example, the programmable thermometer encoded attenuator stages 92 may include a small step programmable thermometer encoded attenuator and one or more large step programmable thermometer encoded attenuators. As an example, the j-th programmable thermometer encoded attenuator stage 102 may be a small step programmable thermometer encoded attenuator. The first programmable thermometer encoded attenuator stage 100 and the k-th programmable thermometer encoded attenuator stage 104 may be large step programmable thermometer encoded attenuators. As an example, each of the one or more large step programmable thermometer encoded attenuators may have an attenuation step size substantially equal to the first attenuation step size. The j-th attenuation step may be fractionally less than the first attenuation step size. In some embodiments, the maximum attenuation level of the small step programmable thermometer encoded attenuator may substantially equal the first attenuation step size. For example, the j-th maximum attenuation level of the j-th programmable thermometer encoded attenuator stage 102 may substantially equal to the first attenuation step size and the k-th attenuation step size.

In some embodiments of the digital step attenuator 84, the control circuitry 86 may adjust the respective attenuation level of each of the large step programmable thermometer encoded attenuators in cascade order. For example, the control circuitry 86 may increase the respective attenuation level of each of the programmable thermometer encoded attenuator stages 92 based on proximity of the large step programmable thermometer encoded attenuator stage to the input interface 88. As an example, to increase the attenuation level of the digital step attenuator 84, the control circuitry 86 may increase the first attenuation level of the first programmable thermometer encoded attenuator stage 100 prior to increasing the k-th attenuation level of the k-th programmable thermometer encoded attenuator stage 104. In this case, the control circuitry 86 may increase the first attenuation level of the first programmable thermometer encoded attenuator stage 100 to substantially equal the first maximum attenuation level of the first programmable thermometer encoded attenuator stage 100. Thereafter, the control circuitry 86 may increase an attenuation level of the one of the large step programmable thermometer encoded attenuators in the cascade of programmable thermometer encoded attenuator stages 94 nearest to the input interface 88. The control circuitry 86 may increase the k-th attenuation level of the k-th programmable thermometer encoded attenuator stage 104 after all the other large step programmable thermometer encoded attenuators in the cascade of programmable thermometer encoded attenuator stages 94 nearest to the input interface 88 are set to provide a respective maximum attenuation level.

Similarly, the control circuitry 86 may decrease the respective attenuation level of each of the large step programmable thermometer encoded attenuator stages of the programmable thermometer encoded attenuator stages 92 in reverse cascade order. In this case, the control circuitry 86 may decrease the respective attenuation level of each of the programmable thermometer encoded attenuator stages 92 based on proximity of each of the large step programmable thermometer encoded attenuator stage to the output interface 90. As an example, to decrease the attenuation level of the digital step attenuator 84, the control circuitry 86 may decrease the k-th attenuation level of the k-th programmable thermometer encoded attenuator stage 104 prior to decreasing the first attenuation level of the first programmable thermometer encoded attenuator stage 100. In this case, the control circuitry 86 may decrease the k-th attenuation level of the k-th programmable thermometer encoded attenuator stage 104 to substantially equal the insertion loss of the k-th programmable thermometer encoded attenuator stage 104.

Thereafter, the control circuitry 86 may decrease an attenuation level of the one of the large step programmable thermometer encoded attenuators in the cascade of programmable thermometer encoded attenuator stages 94 nearest to the output interface 90. The control circuitry 86 may decrease the first attenuation level of the first programmable thermometer encoded attenuator stage 100 after all the other large step programmable thermometer encoded attenuators in the cascade of programmable thermometer encoded attenuator stages 94 nearest to the output interface 90 are set to provide a respective attenuation level substantially equal to the insertion loss.

As a result, the ones of the programmable thermometer encoded attenuator stages 92 nearest the input interface 88 may be configured to handle a higher magnitude signal than the ones of the programmable thermometer encoded attenuator stages 92 nearest the output interface 90.

FIGS. 3A-3E depict various embodiments of digital step attenuators that are based on a cascade of programmable thermometer encoded attenuators.

As an example, FIG. 3A depicts an embodiment of a digital step attenuator 134 including a first large step thermometer encoded attenuator stage 136, a small step thermometer encoded attenuator stage 138, and a second large step thermometer encoded attenuator stage 140. Similar to the digital step attenuator 84 depicted in FIG. 2, the digital step attenuator 134 includes control circuitry 86 configured to receive a control word from the controller 22. Based on the control word, the control circuitry 86 generates first large step thermometer encoded codeword 144, a small step thermometer encoded codeword 146, and a second large step thermometer encoded codeword 148.

The control circuitry 86 may provide the first large step thermometer encoded codeword 144 to the first large step thermometer encoded attenuator stage 136 to set the attenuation level of the first large step thermometer encoded attenuator stage 136. The control circuitry 86 may provide the second large step thermometer encoded codeword 148 to the second large step thermometer encoded attenuator stage 140 to set the attenuation level of the second large step thermometer encoded attenuator stage 140. The control circuitry 86 may provide the small step thermometer encoded codeword 146 to the small step thermometer encoded attenuator stage 138 to set the attenuation level of the small step thermometer encoded attenuator stage 138. The controller 22 may set the composite attenuation level of the digital step attenuator 134 based on the sum of the attenuation levels of the first large step thermometer encoded attenuator stage 136, the small step thermometer encoded attenuator stage 138, and the second large step thermometer encoded attenuator stage 140.

In some embodiments, the first large step thermometer encoded attenuator stage 136 and the second large step thermometer encoded attenuator stage 140 may have a large attenuation step size substantially equal to the maximum attenuation level of the small step thermometer encoded attenuator stage 138. The small step thermometer encoded attenuator stage 138 may have a small attenuation step size substantially equal to an insertion loss of the small step thermometer encoded attenuator stage 138. In addition, the first large step thermometer encoded attenuator stage 136 and the second large step thermometer encoded attenuator stage 140 may have an insertion loss substantially equal to the insertion loss of the small step thermometer encoded attenuator stage 138. As an example, in some embodiments, the insertion loss may be substantially equal to 0.25 dB. In other embodiments, the small step thermometer encoded attenuator stage 138 may have an insertion loss and small attenuation step size substantially equal to 0.125 dB. In still other embodiments, the small step thermometer encoded attenuator stage 138 may have an insertion loss and small attenuation step size substantially equal to 0.0625 dB. Advantageously, the increased granularity between attenuation levels does not increase the total insertion loss.

Table I below illustrates attenuation level setting for one embodiment of the digital step attenuator 134 shown in FIG. 1. In the table below, the digital step attenuator 134 has an attenuation range of 0 to 15.5 dB with an attenuation level step of 0.5 dB.

TABLE I

| Target Attenuation dB | Small Step Attenuator 138 0 to 0.75 dB in 1 dB increments dB | First large Step Attenuator 136 0 to 6 dB in 2 dB increments dB | Second large Step Attenuator 140 0 to 8 dB in 2 dB increments dB |
|---|---|---|---|
| 0 | 0 | 0 | 0 |
| 0.5 | 0.5 | 0 | 0 |
| 1 | 1 | 0 | 0 |
| 1.5 | 1.5 | 0 | 0 |
| 2 | 0 | 2 | 0 |
| 2.5 | 0.5 | 2 | 0 |
| 3 | 1 | 2 | 0 |
| 3.5 | 1.5 | 2 | 0 |
| 4 | 0 | 4 | 0 |
| 4.5 | 0.5 | 4 | 0 |
| 5 | 1 | 4 | 0 |
| 5.5 | 1.5 | 4 | 0 |
| 6 | 0 | 6 | 0 |
| 6.5 | 0.5 | 6 | 0 |
| 7 | 1 | 6 | 0 |
| 7.5 | 1.5 | 6 | 0 |
| 8 | 0 | 6 | 2 |
| 8.5 | 0.5 | 6 | 2 |
| 9 | 1 | 6 | 2 |
| 9.5 | 1.5 | 6 | 2 |
| 10 | 0 | 6 | 4 |
| 10.5 | 0.5 | 6 | 4 |
| 11 | 1 | 6 | 4 |
| 11.5 | 1.5 | 6 | 4 |
| 12 | 0 | 6 | 6 |
| 12.5 | 0.5 | 6 | 6 |
| 13 | 1 | 6 | 6 |
| 13.5 | 1.5 | 6 | 6 |
| 14 | 0 | 6 | 8 |
| 14.5 | 0.5 | 6 | 8 |
| 15 | 1 | 6 | 8 |
| 15.5 | 1.5 | 6 | 8 |

Figure 3B:
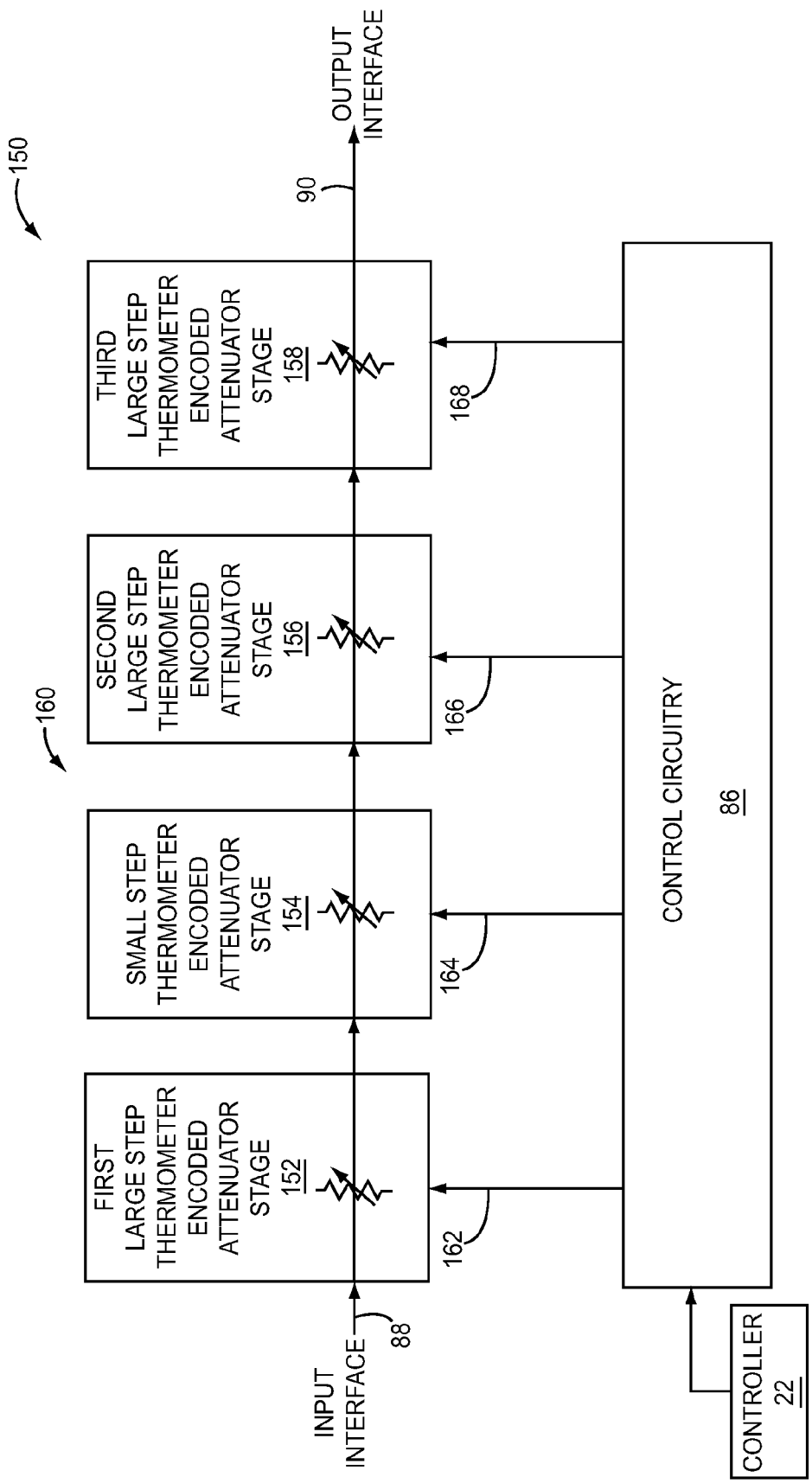

FIG. 3B depicts an embodiment of a digital step attenuator 150 including a first large step thermometer encoded attenuator stage 152, a small step thermometer encoded attenuator stage 154, a second large step thermometer encoded attenuator stage 156, and a third large step thermometer encoded attenuator stage 158. The first large step thermometer encoded attenuator stage 152, the small step thermometer encoded attenuator stage 154, the second large step thermometer encoded attenuator stage 156, and the third large step thermometer encoded attenuator stage 158 may be arranged to form a cascade of programmable thermometer encoded attenuators 160 between the input interface 88 and the output interface 90. The control circuitry 86 may generate a first large step thermometer encoded code word 162, a small step thermometer encoded code word 164, a second step thermometer encoded code word 166, and a third large step thermometer encoded code word 168 as a function of a control word received from the controller 22.

The digital step attenuator 150 may be configured to operate in a substantially similar manner as the digital step attenuator 134 (FIG. 3A) by configuring the first large step thermometer encoded code word 162, the second step thermometer encoded code word 166, and the third large step thermometer encoded code word 168 to each have a full scale range substantially equal to 10 dB, an insertion loss of 0.25 dB, and a large attenuation step size substantially equal to 2 dB. The small step thermometer encoded attenuator stage 154 may have an insertion loss of 0.25 dB, a full scale range of 1.75 dB and a small attenuation step size substantially equal to 0.25 dB. Because the digital step attenuator 150 has four attenuator stages, the insertion loss between the input interface 88 and the output interface 90 may be substantially equal to 1 dB. As described above, in some embodiments, the digital step attenuator 150 may be configured to increase granularity between attenuation levels. For example, similar to the digital step attenuator 134 depicted in FIG. 3A, the small step thermometer encoded attenuator stage 154 may be configured to have a small attenuation step size 0.125 dB or 0.0625 dB.

Figure 3C:
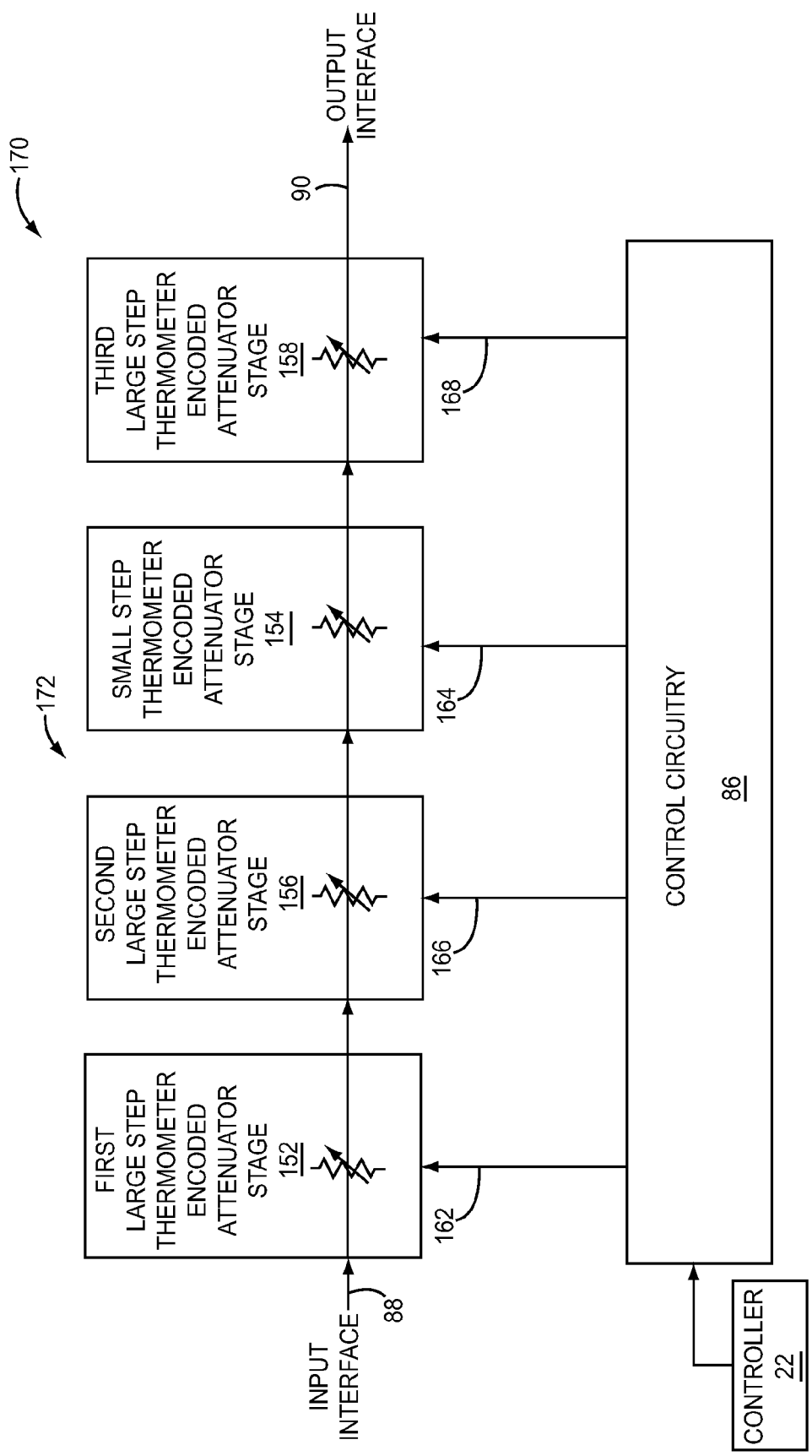

FIG. 3C depicts another embodiment of a digital step attenuator 170 including the first large step thermometer encoded attenuator stage 152, the small step thermometer encoded attenuator stage 154, the second large step thermometer encoded attenuator stage 156, and the third large step thermometer encoded attenuator stage 158. The first large step thermometer encoded attenuator stage 152, the small step thermometer encoded attenuator stage 154, the second large step thermometer encoded attenuator stage 156, and the third large step thermometer encoded attenuator stage 158 may be arranged to form a cascade of programmable thermometer encoded attenuators 172. Unlike the digital step attenuator 150 depicted in FIG. 3B, which had the cascade order of the first large step thermometer encoded attenuator stage 152, the small step thermometer encoded attenuator stage 154, the second large step thermometer encoded attenuator stage 156, and the third large step thermometer encoded attenuator stage 158, as shown in FIG. 3C, digital step attenuator 170 is arranged such that the small step thermometer encoded attenuator stage 154 is in the third position of the cascade of programmable thermometer encoded attenuators 172. The order shown in FIG. 3C is as follows: the first large step thermometer encoded attenuator stage 152, the second large step thermometer encoded attenuator stage 156, and the third large step thermometer encoded attenuator stage 158 are located in the first position, the second position, and the fourth position of the cascade of programmable thermometer encoded attenuators 172.

Figure 3D:
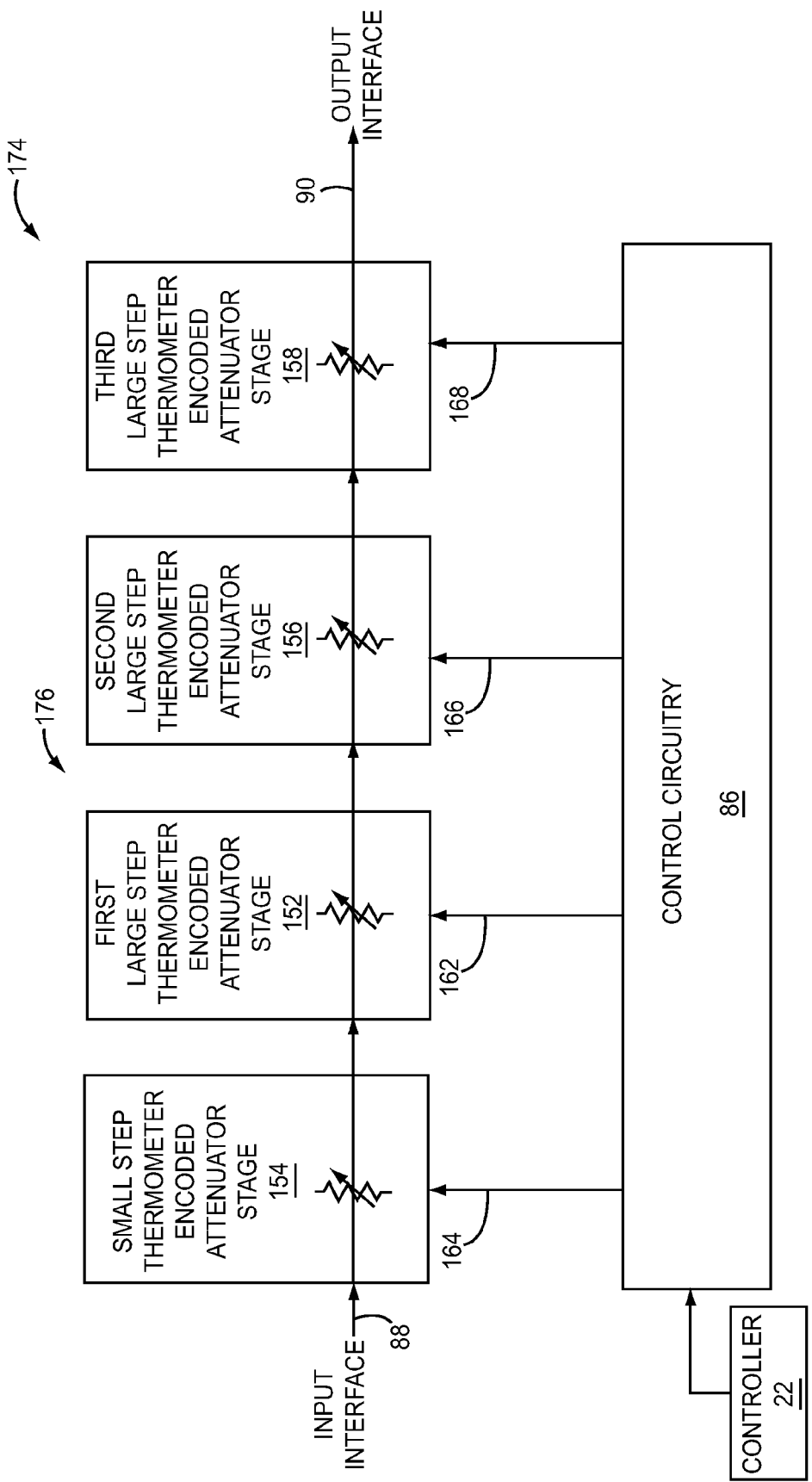

FIG. 3D depicts another embodiment of a digital step attenuator 174 that is similar to the digital step attenuator 150, depicted in FIG. 3B, and the digital step attenuator 170, depicted in FIG. 3C. The digital step attenuator 174 includes the first large step thermometer encoded attenuator stage 152, the small step thermometer encoded attenuator stage 154, the second large step thermometer encoded attenuator stage 156, and the third large step thermometer encoded attenuator stage 158 arranged to form a cascade of programmable thermometer encoded attenuators 176. In cascade of programmable thermometer encoded attenuators 176, the small step thermometer encoded attenuator stage 154 is in the first position of the cascade of programmable thermometer encoded attenuators 176. The first large step thermometer encoded attenuator stage 152, the second large step thermometer encoded attenuator stage 156, and the third large step thermometer encoded attenuator stage 158 are in the second position, third position, and fourth position of the cascade of programmable thermometer encoded attenuators 176, respectively.

Figure 3E:
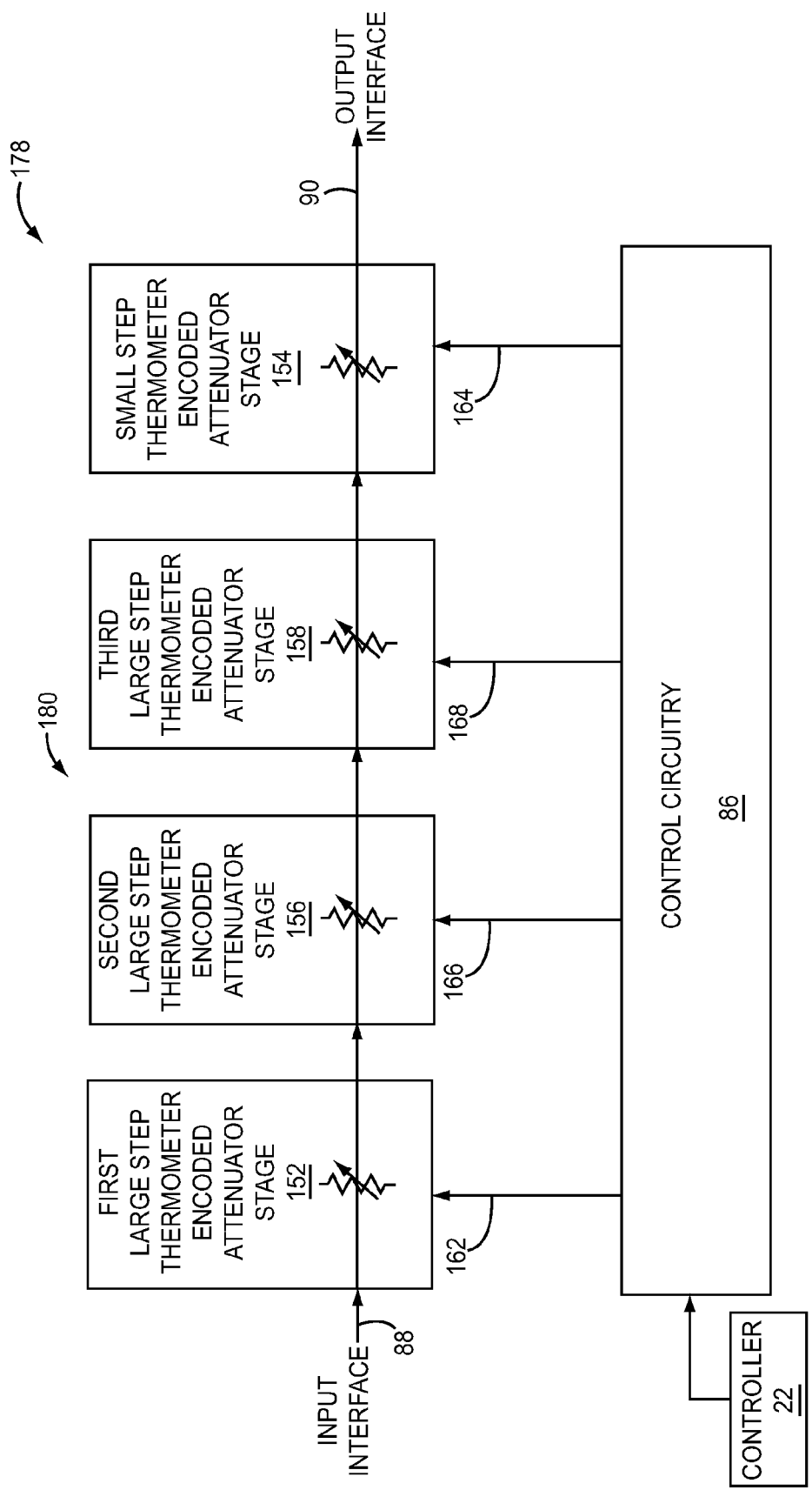

FIG. 3E depicts another embodiment of a digital step attenuator 178 that is similar to the digital step attenuator 150, depicted in FIG. 3B, the digital step attenuator 170, depicted in FIG. 3C, and the digital step attenuator 174, depicted in FIG. 3D. The digital step attenuator 178 includes the first large step thermometer encoded attenuator stage 152, the small step thermometer encoded attenuator stage 154, the second large step thermometer encoded attenuator stage 156, and the third large step thermometer encoded attenuator stage 158 arranged to form a cascade of programmable thermometer encoded attenuators 180. In cascade of programmable thermometer encoded attenuators 180, the small step thermometer encoded attenuator stage 154 is in the fourth position of the cascade of programmable thermometer encoded attenuators 180. The first large step thermometer encoded attenuator stage 152, the second large step thermometer encoded attenuator stage 156, and the third large step thermometer encoded attenuator stage 158 are in the first position, second position, and third position of the cascade of programmable thermometer encoded attenuators 180, respectively.

Figure 4A:
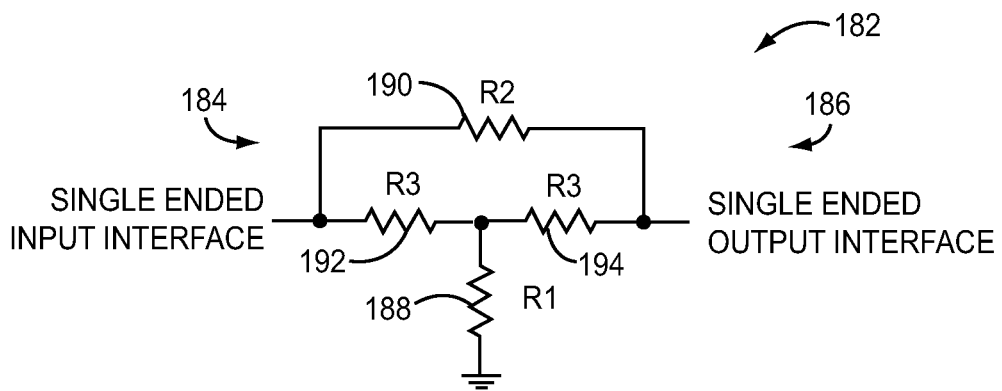
FIGS. 4A-4F illustrate various topologies for the attenuator stages.

As depicted in FIGS. 4A-F, digital step attenuators may be formed based on different type of attenuator cell styles or topologies. As an example, some digital step attenuators may include a Bridged Tee Attenuator topology 182, as depicted in FIG. 4A. The Bridged Tee Attenuator topology 182 may have a single ended input interface 184 and a single ended output interface 186. The Bridged Tee Attenuator topology 182 includes a shunt impedance 188 having a shunt impedance value substantially equal to R1, a series impedance 190 having a series impedance value substantially equal to R2, and a first characteristic impedance 192 and a second characteristic impedance 194 having a characteristic impedance value substantially equal to R3. For example, in some embodiments, the characteristic impedance value may be substantially equal to 50 ohms or 75 ohms. The series impedance 190 may have a first terminal in communication with the single ended input interface 184 and a second terminal in communication with the single ended output interface 186. The first characteristic impedance 192 may include a first terminal in communication with the single ended input interface 184 and a second terminal. The second characteristic impedance 194 may include a first terminal in communication with the single ended output interface 186 and a second terminal in communication with the second terminal of the first characteristic impedance 192. The shunt impedance 188 may include a first terminal in communication with the second terminal of the first characteristic impedance 192 and the second terminal of the second characteristic impedance 194. The shunt impedance 188 may further include a second terminal in communication with a common voltage or ground.

The attenuation level of the Bridged Tee Attenuator topology 182 may be configured to have an attenuation level as a function of the shunt impedance value substantially equal to R1, the series impedance value substantially equal to R2, and the characteristic impedance value substantially equal to R3.

Figure 4B:
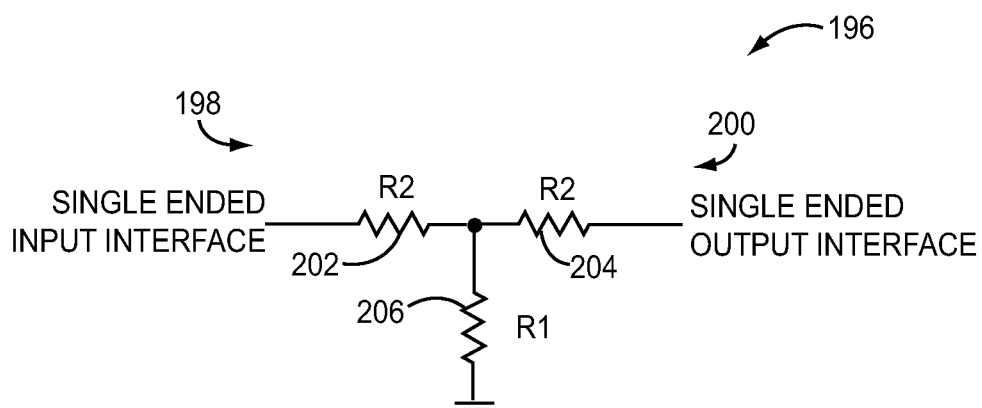

As another example, some digital step attenuators may include a Tee Attenuator topology 196, as depicted in FIG. 4B. The Tee Attenuator topology 196 may have a single ended input interface 198 and a single ended output interface 200. The Tee Attenuator topology 196 may include a first series impedance 202 and a second series impedance 204 each having a series impedance substantially equal to R2. The first series impedance 202 may include a first terminal in communication with the single ended input interface 198 and a second terminal. The second series impedance 204 may include a first terminal in communication with the single ended output interface 200 and a second terminal in communication with the second terminal of the first series impedance 202. The Tee Attenuator topology 196 may further include a shunt impedance 206 having a shunt impedance value substantially equal to R1. The shunt impedance 206 may have a first terminal in communication with the second terminal of the first series impedance 202 and the second terminal of the second series impedance 204. The shunt impedance 206 may further have a second terminal in communication with a common voltage or ground. Tee Attenuator topology 196 may be configured to have an attenuation level as a function of a relationship between the shunt impedance value substantially equal to R1 and the series impedance value substantially equal to R2.

Figure 4C:
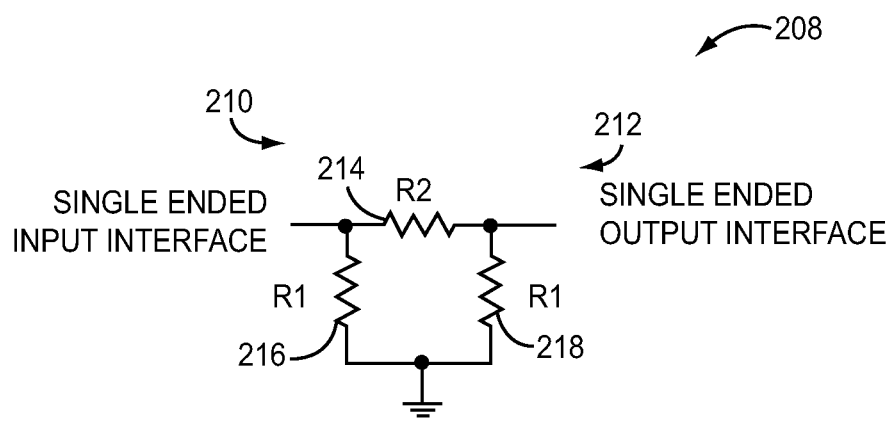

As another example, some digital step attenuators may include a Pi Attenuator topology 208, as depicted in FIG. 4C. The Pi Attenuator topology 208 may have a single ended input interface 210 and a single ended output interface 212. The Pi Attenuator topology 208 may include a series impedance 214 having a series impedance substantially equal to R2. The series impedance 214 may include a first terminal in communication with the single ended input interface 210 and a second terminal in communication with the single ended output interface 212. The Pi Attenuator topology 208 may further include a first shunt impedance 216 and a second shunt impedance 218 each having a shunt impedance value substantially equal to R1. The first shunt impedance 216 may have a first terminal in communication with the single ended input interface 210 and a second terminal in communication with a common voltage or ground. The second shunt impedance 218 may have a first terminal in communication with the single ended output interface 212 and a second terminal in communication with a common voltage or ground.

The Pi Attenuator topology 208 may be configured to have an attenuation level as a function of a relationship between the shunt impedance value substantially equal to R1 and the series impedance value substantially equal to R2.

Figure 4D:
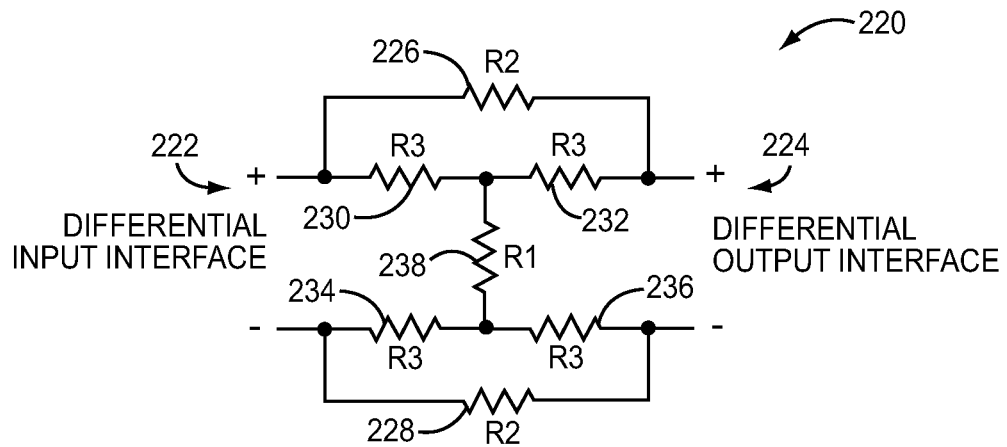

Some embodiments of a digital step attenuator may include a balanced or differential attenuator topology. For example, FIG. 4D depicts a Bridged H Attenuator topology 220 including a differential input interface 222 and a differential output interface 224. The differential input interface 222 may include a non-inverting terminal (+) and an inverting terminal (−). The differential output interface 224 may include a non-inverting terminal (+) and an inverting terminal (−). The Bridged H Attenuator topology 220 may include a first series impedance 226 and a second series impedance 228 each having a series impedance value substantially equal to R2. The Bridged H Attenuator topology 220 may further include a first characteristic impedance 230, a second characteristic impedance 232, a third characteristic impedance 234, and a fourth characteristic impedance 236 each having a characteristic impedance value substantially equal to R3. In some embodiments, the characteristic impedance value substantially equal to R3 may be 50 ohms or 75 ohms. The Bridged H attenuator topology 220 may further include a shunt impedance 238 having a shunt impedance value substantially equal to R1. The first series impedance 226 may include a first terminal in communication with the non-inverting terminal (+) of the differential input interface 222 and a second terminal in communication with the non-inverting terminal (+) of the differential output interface 224. The second series impedance 228 may include a first terminal in communication with the inverting terminal (−) of the differential input interface 222 and a second terminal in communication with the inverting terminal (−) of the differential output interface 224. The first characteristic impedance 230 may include a first terminal in communication with the first terminal of the first series impedance 226 and a second terminal. The second characteristic impedance 232 may include a first terminal in communication with the second terminal of the first series impedance 226 and a second terminal in communication with the second terminal of the first characteristic impedance 230. The third characteristic impedance 234 may include a first terminal in communication with the first terminal of the second series impedance 228 and a second terminal. The fourth characteristic impedance 236 may include a first terminal in communication with the second terminal of the second series impedance 228 and a second terminal in communication with the second terminal of the third characteristic impedance 234. The shunt impedance 238 may include a first terminal in communication with the second terminal of the first characteristic impedance 230 and the second terminal of the second characteristic impedance 232. The shunt impedance 238 may further include a second terminal in communication with the second terminal of the third characteristic impedance 234 and the second terminal of the fourth characteristic impedance 236.

The Bridged H Attenuator topology 220 may be configured to have an attenuation level as a function of a relationship between the shunt impedance value substantially equal to R1, the series impedance value substantially equal to R2, and the characteristic impedance value substantially equal to R3.

Figure 4E:
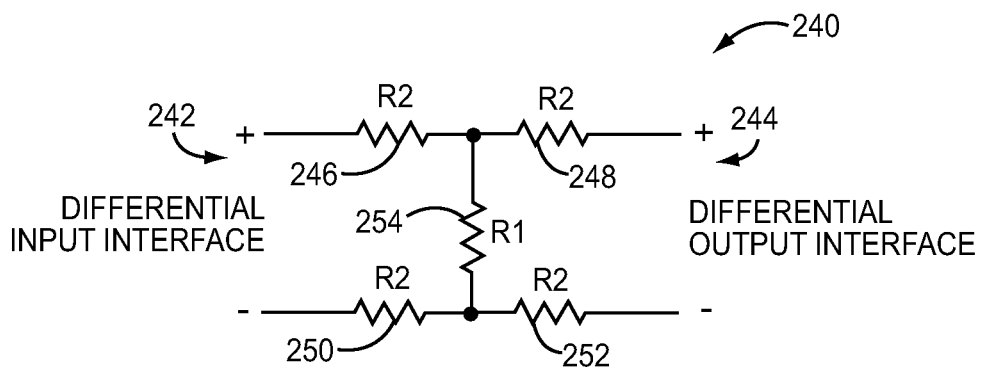

As another example differential or balanced attenuator, FIG. 4E depicts an H-Attenuator topology 240 including a differential input interface 242 and a differential output interface 244. The differential input interface 242 may include a non-inverting terminal (+) and an inverting terminal (−). The differential output interface 244 may include a non-inverting terminal (+) and an inverting terminal (−). The H Attenuator topology 240 may include a first series impedance 246, a second series impedance 248, a third series impedance 250, and a fourth series impedance 252 each having a series impedance value substantially equal to R2. The H Attenuator topology 240 may further include a shunt impedance 254 having a shunt impedance value substantially equal to R1. The first series impedance 246 may include a first terminal in communication with the non-inverting terminal (+) of the differential input interface 242 and a second terminal. The second series impedance 248 may include a first terminal in communication with the non-inverting terminal (+) of the differential output interface 244 and a second terminal in communication with the second terminal of the first series impedance 246. The third series impedance 250 may include a first terminal in communication with the inverting terminal (−) of the differential input interface 242 and a second terminal. The fourth series impedance 252 may include a first terminal in communication with the inverting terminal (−) of the differential output interface 244 and a second terminal of the third series impedance 250. The shunt impedance 254 may include a first terminal in communication with the second terminal of the first series impedance 246 and the second terminal of the second series impedance 248. The shunt impedance 254 may further include a second terminal in communication with the second terminal of the third series impedance 250 and the second terminal of the fourth series impedance 252.

The H attenuator topology 240 may be configured to have an attenuation level as a function of a relationship between the shunt impedance value substantially equal to R1 and the series impedance value substantially equal to R2.

Figure 4F:
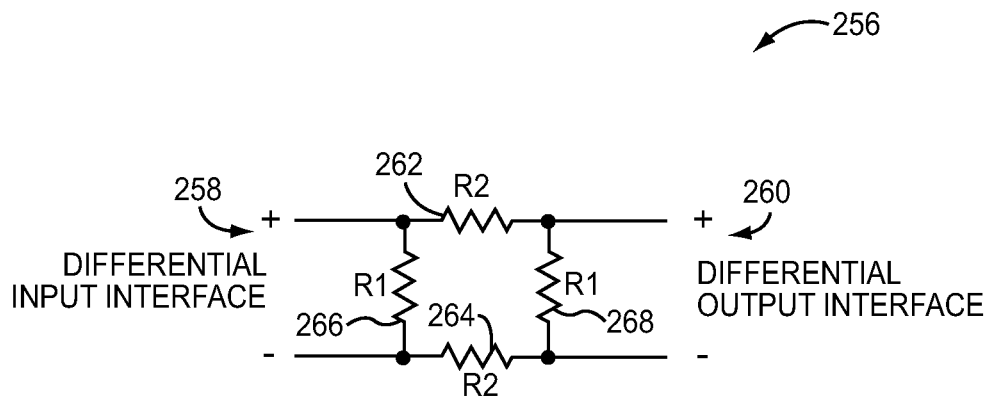

As another example differential or balanced attenuator, FIG. 4F depicts an O-Attenuator topology 256 including a differential input interface 258 and a differential output interface 260. The differential input interface 258 may include a non-inverting terminal (+) and an inverting terminal (−). The differential output interface 260 may include a non-inverting terminal (+) and an inverting terminal (−). The O-Attenuator topology 256 may include a first series impedance 262 and a second series impedance 264, each having a series impedance value substantially equal to R2. The O-Attenuator topology 256 may further include a first shunt impedance 266 and a second shunt impedance 268, each having a shunt impedance value substantially equal to R1. The first series impedance 262 may include a first terminal in communication with the non-inverting terminal (+) of the differential input interface 258 and a second terminal in communication with the non-inverting terminal (+) of the differential output interface 260. The second series impedance 264 may include a first terminal in communication with the inverting terminal (−) of the differential input interface 258 and a second terminal in communication with the inverting terminal (−) of the differential output interface 260. The first shunt impedance 266 may include a first terminal in communication with the non-inverting terminal (+) of the differential input interface 258 and a second terminal in communication with the inverting terminal (−) of the differential input interface 258. The second shunt impedance 268 may include a first terminal in communication with the non-inverting terminal (+) of the differential output interface 260 and a second terminal in communication with the inverting terminal (−) of the differential output interface 260. The O attenuator topology 256 may be configured to have an attenuation level as a function of a relationship between the shunt impedance value substantially equal to R1 and the series impedance value substantially equal to R2.

Referring to FIGS. 4A-F, the Bridged Tee Attenuator topology 182, the Tee Attenuator topology 196, the Pi Attenuator topology 208, the Bridged H Attenuator topology 220, the H Attenuator topology 240, and the O Attenuator topology 256 may be used to implement various forms of programmable thermometer encoded attenuators. As an example, arrays of switched impedances may be used to provide the shunt impedance value substantially equal to R1 and the series impedance value substantially equal to R2.

Figure 5A:
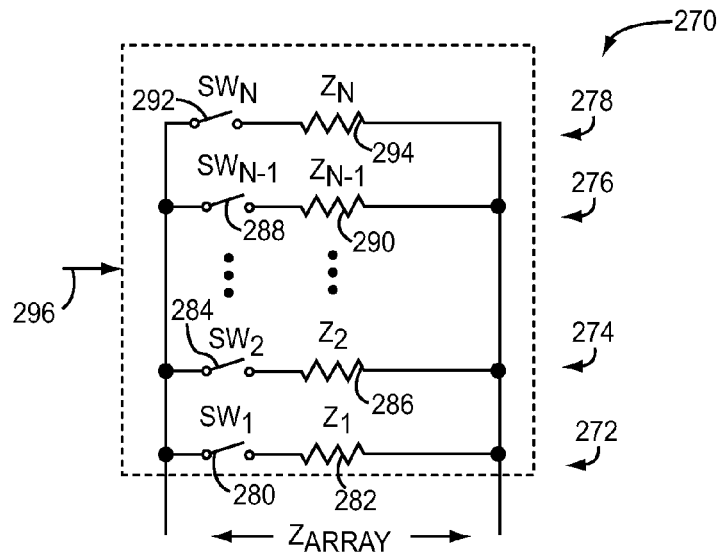
FIGS. 5A-5D illustrate various embodiments of arrays of switchable impedances that may be utilized within a programmable thermometer encoded attenuator stage.

FIG. 5A depicts an array of switched impedances 270 configured to provide an array impedance value substantially equal to ZARRAY. For example, the array of switched impedances 270 may include "N" number of switched impedances. The array of switched impedances 270 may include a first switched impedance 272, a second switched impedance 274, an N−1th switched impedance 276, and an Nth switched impedance 278. Each of the first switched impedance 272, the second switched impedance 274, the N−1th switched impedance 276, and the Nth switched impedance 278 may include a switch element in series with an impedance element. For example, the first switched impedance 272 may include a first switch element 280, SW1, in series with a first impedance 282 having a first impedance value substantially equal to Z1. The second switched impedance 274 may include a second switch element 284, SW2, in series with a second impedance 286 having a second impedance value substantially equal to Z2. The N−1th switched impedance 276 may include an N−1 th switch element 288, SWN−1, in series with an N−1 th impedance 290 having an N−1th impedance substantially equal to ZN−1. The Nth switched impedance 278 may include an Nth switch element 292, SWN, in series with an Nth impedance 294 having an N-th impedance value substantially equal to ZN. The first impedance value Z1 through the Nth impedance value may be configured to provide a thermometer encoded attenuation have a desired attenuator step size and insertion loss. In some embodiments, a shunt impedance value substantially equal to R1 or a series impedance value substantially equal to R2 may be obtained by switchably combining the first impedance 282 through the Nth impedance 294 to obtain the array impedance value substantially equal to ZARRAY. As an example, the switched impedance control signals may be in communication with the first switch element 280 through the Nth switch element 292, SWN. As an example referring to FIG. 2, the switched impedance control signals 296 may correspond to the first thermometer encoded control signals 112, the j-th thermometer encoded control signals 122, or the k-th thermometer encoded control signals 132. Accordingly, the control word may be used to generate the switched impedance control signals 296 to switchably govern the operation of each of the first switched impedance 272 through the Nth switched impedance 278 to provide an thermometer encoded attenuation level for each of the first programmable thermometer encoded attenuator stage 100, the j-th programmable encoded attenuator stage 102, and the k-th programmable encoded attenuator stage 102.

As a non-limiting example, referring to FIGS. 3A-3E, FIG. 4C, and FIG. 5A, in some embodiments the various embodiments of a digital step attenuator, the large step thermometer encoded attenuator stages may be based on a Pi Attenuator topology 208 where the first shunt impedance 216 and the second shunt impedance 218 are each replaced by an array of switched impedances 270. Similarly, as a further non-limiting example referring to FIGS. 3A-3E, FIG. 4A, and FIG. 5A, in some of the various embodiments of a digital step attenuator, the small step thermometer encoded stages may be based on a Bridged Tee Attenuator topology 182 where the shunt impedance 188 and the series impedance 190 are each replaced by an array of switched impedances 270. Each of the first impedance value through the N-th impedance value of the respective array of switched impedances 270 may be selected such that when added in parallel the respective array impedance values provide a thermometer encoded attenuation level as a function of the control word provided by the controller 22.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The arbiters, master devices, and slave devices described herein may be employed in any circuit, hardware component, integrated circuit (IC), or IC chip, as non-limiting examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a processor, a DSP, an Application Specific Integrated Circuit (ASIC), an FPGA or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

Figure 5B:
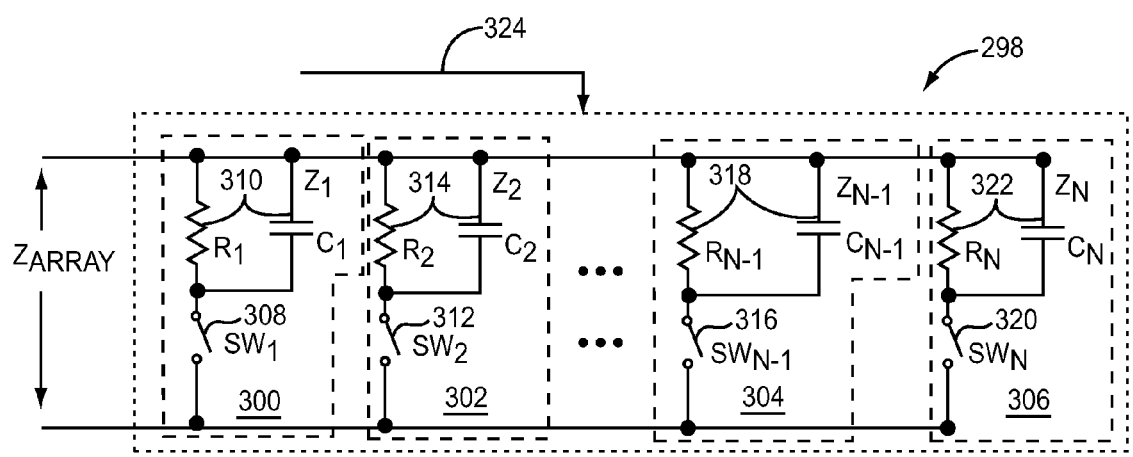

FIG. 5B depicts another embodiment of an array of switched impedances 298 configured to provide an array impedance value substantially equal to ZARRAY. The array of switched impedances 298 may include "N" number of switched impedances. Accordingly, the array of switched impedances 298 may include a first switched impedance 300, a second switched impedance 302, an N–1th switched impedance 304, and an Nth switched impedance 306. Each of the first switched impedance 300, the second switched impedance 302, the N–1th switched impedance 304, and the Nth switched impedance 306 may include a switch element in series with an impedance element. For example, the first switched impedance 300 may include a first switch element 308, SW1, in series with a first impedance 310 having a first impedance value substantially equal to ZARRAY. The second switched impedance 302 may include a second switch element 312, SW2, in series with a second impedance 314 having a second impedance value substantially equal to Z2. The N–1th switched impedance 304 may include an N–1th switch element 316, SWN–1, in series with an N–1th impedance 318 having an N–1th impedance substantially equal to ZN–1. The Nth switched impedance 306 may include an Nth switch element 320, SWN, in series with an Nth impedance 322 having an N-th impedance value substantially equal to ZN. The first impedance value Z1 through the Nth impedance value may be configured to provide a thermometer encoded attenuation have a desired attenuator step size and insertion loss. In some embodiments, a shunt impedance value substantially equal to R1 or a series impedance value substantially equal to R2 may be obtained by switchably combining the first impedance 310 through the Nth impedance 322 to obtain the array impedance value substantially equal to ZARRAY. As an example, the switched impedance control signals may be in communication with the first switch element 308 through the Nth switch element 320, SWN. The switched impedance control signals 324 may correspond to the first thermometer encoded control signals 112, the j-th thermometer encoded control signals 122, or the k-th thermometer encoded control signals 132. Accordingly, the control word may be used to generate the switched impedance control signals 324 to switchably govern the operation of each of the first switched impedance 310 through the Nth switched impedance 322 to provide an thermometer encoded attenuation level for each of the first programmable thermometer encoded attenuator stage 100, the j-th programmable encoded attenuator stage 102, and the k-th programmable encoded attenuator stage 102.

As a non-limiting example, referring to FIGS. 3A-3E, FIG. 4C, and FIG. 5B, in some of the various embodiments of a digital step attenuator, the large step thermometer encoded attenuator stages may be based on a Pi Attenuator topology 208 where the first shunt impedance 216 and the second shunt impedance 218 are each replaced by an array of switched impedances 298. Similarly, as a further non-limiting example referring to FIGS. 3A-3E, FIG. 4A, and FIG. 5A, in some of the various embodiments of a digital step attenuator, the small step thermometer encoded stages may be based on a Bridged Tee Attenuator topology 182 where the shunt impedance 188 and the series impedance 190 are each replaced by an array of switched impedances 298. Each of the first impedance value through the N-th impedance value of the respective array of switched impedances 298 may be selected such that when added in parallel, the respective array impedance values provide a thermometer encoded attenuation level as a function of the control word provided by the controller 22.

Figure 5C:
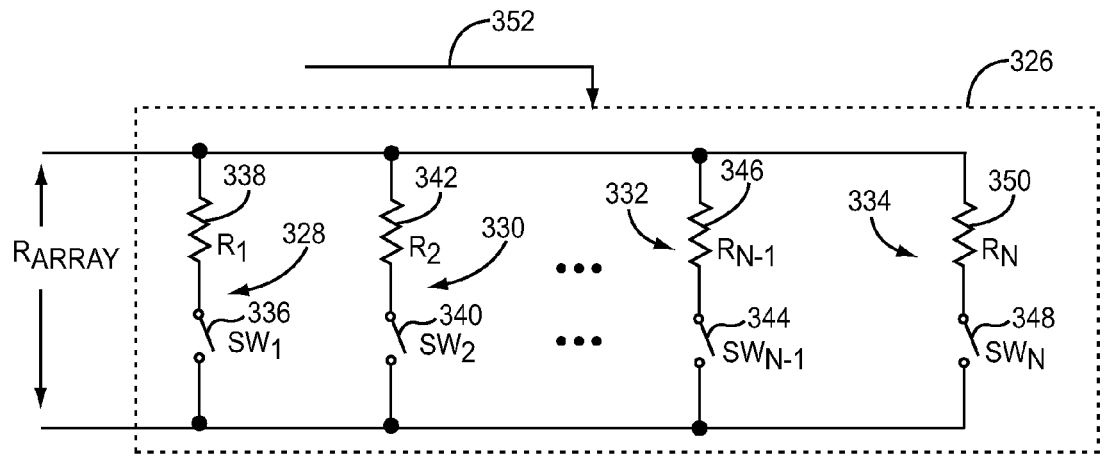

FIG. 5C depicts another embodiment of an array of switched impedances 326 configured to provide an array impedance value substantially equal to RARRAY. In this example, the array of switched impedances is an array of switched resistors and thus RARRAY is real rather than complex. The array of switched impedances 326 may include "N" number of switched impedances. Accordingly, the array of switched impedances 326 may include a first switched impedance 328, a second switched impedance 330, an N–1th switched impedance 332, and an Nth switched impedance 334. Each of the first switched impedance 328, the second switched impedance 330, the N–1th switched impedance 332, and the Nth switched impedance 334 may include a switch element in series with an impedance element. For example, the first switched impedance 328 may include a first switch element 336, SW1, in series with a first impedance 338. The first impedance 338 has a first real impedance value substantially equal to R1. The second switched impedance 330 may include a second switch element 340, SW2, in series with a second impedance 342 having a second real impedance value substantially equal to R2. The N–1th switched impedance 332 may include an N–1th switch element 344, SWN–1, in series with an N–1th impedance 346 having an N–1th real impedance value substantially equal to RN–1. The Nth switched impedance 334 may include an Nth switch element 348, SWN, in series with an Nth impedance 350 having an Nth impedance real impedance value substantially equal to RN. The first impedance value R1 through the Rth impedance value may be configured to provide a thermometer encoded attenuation having a desired attenuator step size and insertion loss. In some embodiments, a shunt impedance value or a series impedance value substantially may be obtained by switchably combining the first impedance 338 through the Nth impedance 340 to obtain the array impedance value substantially equal to RARRAY. As an example, the switched impedance control signals may be in communication with the first switch element 336 through the Nth switch element 348, SWN. The switched impedance control signals 352 may correspond to the first thermometer encoded control signals 112, the j-th thermometer encoded control signals 122, or the k-th thermometer encoded control signals 132 in FIG. 2. Accordingly, the control word may be used to generate the switched impedance control signals 352 to switchably govern the operation of each of the first switched impedance 328 through the Nth switched impedance 334 to provide an thermometer encoded attenuation level for each of the first programmable thermometer encoded attenuator stage 100, the j-th programmable encoded attenuator stage 102, and the k-th programmable encoded attenuator stage 102 in FIG. 2.

As a non-limiting example, referring to FIGS. 3A-3E, FIG. 4C, and FIG. 5C, in some embodiments the various embodiments of a digital step attenuator, the large step thermometer encoded attenuator stages may be based on a Pi Attenuator topology 208 where the first shunt impedance 216 and the second shunt impedance 218 are each replaced by an array of switched impedances 326. Similarly, as a further non-limiting example referring to FIGS. 3A-3E, FIG. 4A, and FIG. 5C, in some of the various embodiments of a digital step attenuator, the small step thermometer encoded stages may be based on a Bridged Tee Attenuator topology 182 where the shunt impedance 188 and the series impedance 190 are each replaced by an array of switched impedances 326. Each of the first impedance value through the N-th impedance value of the respective array of switched impedances 326 may be selected such that when added in parallel the respective array impedance values provide a thermometer encoded attenuation level as a function of the control word provided by the controller 22.

Figure 5D:
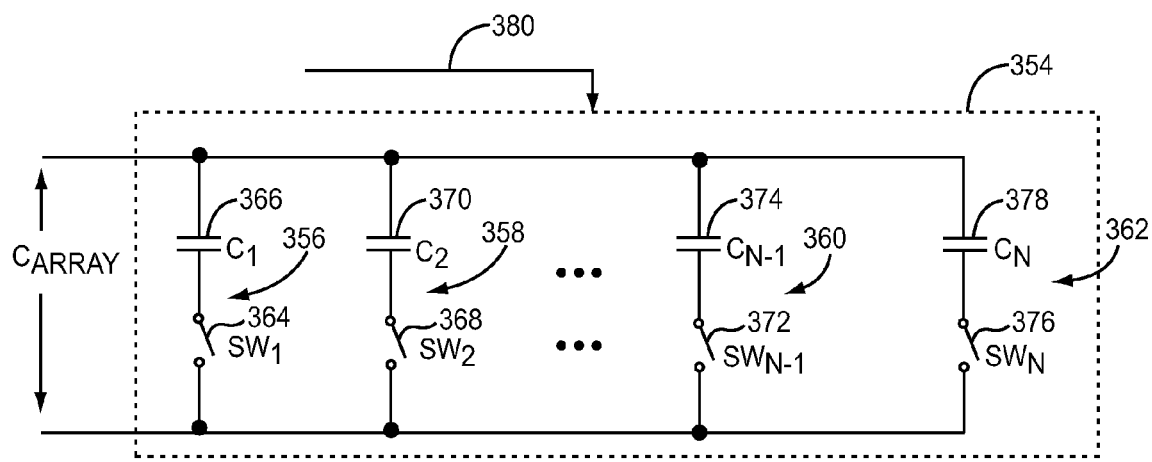

FIG. 5D depicts another embodiment of an array of switched impedances 354 configured to provide an array impedance value substantially equal to CARRAY. In this example, the array of switched impedances is an array of switched capacitors and thus CARRAY is reactive, and in particular capacitive, rather than complex. The array of switched impedances 354 may include "N" number of switched impedances. Accordingly, the array of switched impedances 354 may include a first switched impedance 356, a second switched impedance 358, an N−1th switched impedance 360, and an Nth switched impedance 362. Each of the first switched impedance 356, the second switched impedance 358, the N−1th switched impedance 360, and the Nth switched impedance 362 may include a switch element in series with an impedance element. For example, the first switched impedance 356 may include a first switch element 364, SW1, in series with a first impedance 366. The first impedance 366 has a first capacitive impedance value substantially equal to C1. The second switched impedance 358 may include a second switch element 368, SW2, in series with a second impedance 370 having a second capacitive impedance value substantially equal to C2. The N−1th switched impedance 360 may include an N−1th switch element 372, SWN−1, in series with an N−1th impedance 374 having an N−1th capacitive impedance value substantially equal to CN−1. The Nth switched impedance 362 may include an Nth switch element 376, SWN, in series with an Nth impedance 350 having an N-th impedance real impedance value substantially equal to CN. The first capacitive impedance value C1 through the Cth capacitive impedance value may be configured to provide a thermometer encoded attenuation having a desired attenuator step size and insertion loss. In some embodiments, a shunt impedance value substantially or a series impedance value substantially may be obtained by switchably combining the first impedance 366 through the Nth impedance 378 to obtain the array impedance value substantially equal to CARRAY. As an example, the switched impedance control signals may be in communication with the first switch element 364 through the Nth switch element 376, SWN. The switched impedance control signals 380 may correspond to the first thermometer encoded control signals 112, the j-th thermometer encoded control signals 122, or the k-th thermometer encoded control signals 132 in FIG. 2. Accordingly, the control word may be used to generate the switched impedance control signals 380 to switchably govern the operation of each of the first switched impedance 356 through the Nth switched impedance 362 to provide an thermometer encoded attenuation level for each of the first programmable thermometer encoded attenuator stage 100, the j-th programmable encoded attenuator stage 102, and the k-th programmable encoded attenuator stage 102 in FIG. 2.

As a non-limiting example, referring to FIGS. 3A-3E, FIG. 4C, and FIG. 5C, in some embodiments the various embodiments of a digital step attenuator, the large step thermometer encoded attenuator stages may be based on a PI Attenuator topology 208 where the first shunt impedance 216 and the second shunt impedance 218 are each replaced by an array of switched impedances 326. Similarly, as a further non-limiting example referring to FIGS. 3A-3E, FIG. 4A, and FIG. 5D, in some of the various embodiments of a digital step attenuator, the small step thermometer encoded attenuator stages may be based on a Bridged Tee Attenuator topology 182 where the shunt impedance 188 and the series impedance 190 are each replaced by an array of switched impedances 354. Each of the first impedance value through the N-th impedance value of the respective array of switched impedances 354 may be selected such that when added in parallel, the respective array impedance values provide a thermometer encoded attenuation level as a function of the control word provided by the controller 22.

Figure 6:
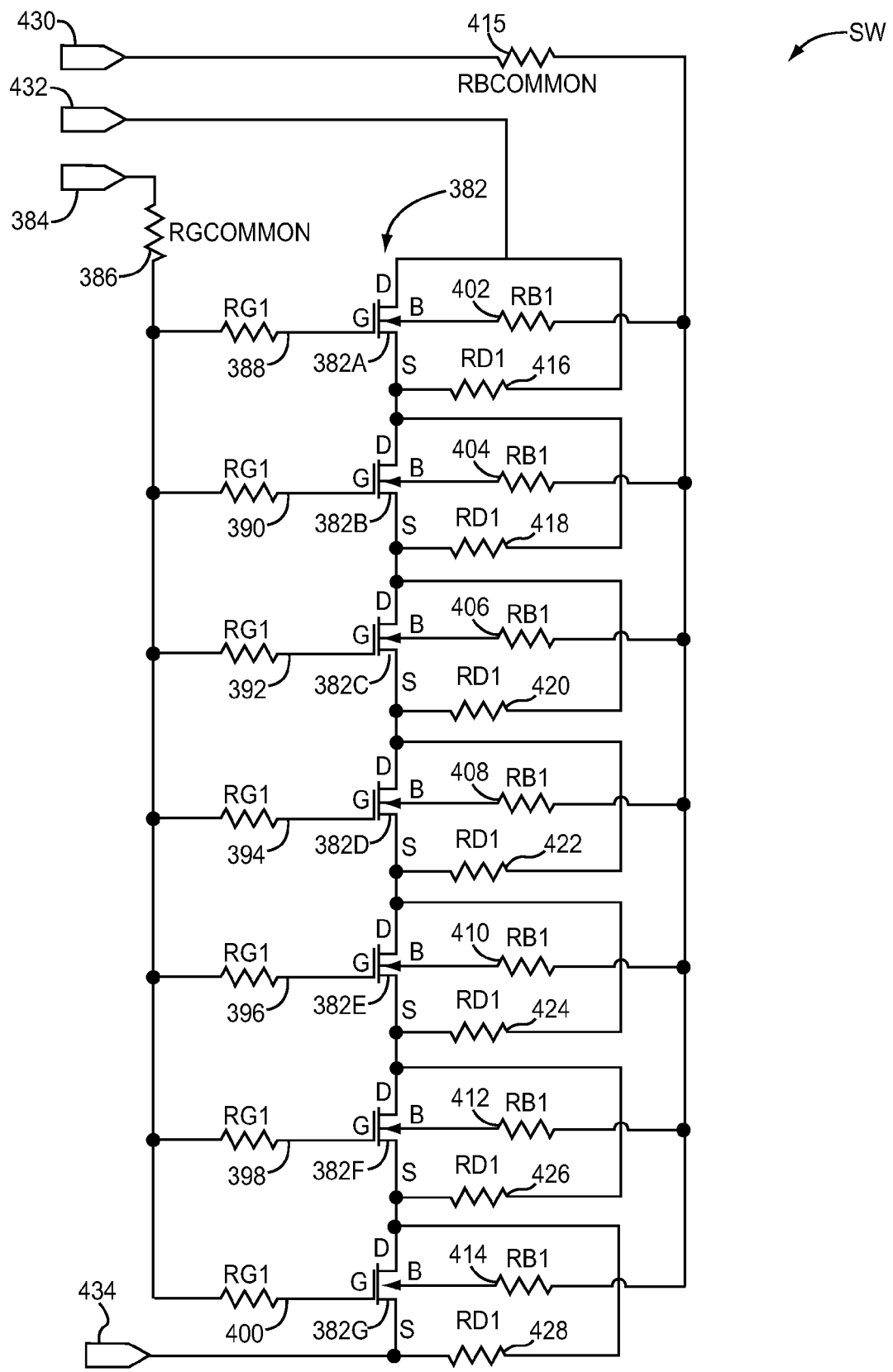
FIG. 6 illustrates an embodiment of a low distortion stacked FET switch which may be utilized in an array of switchable impedances.

FIG. 6 illustrates one embodiment of a switch SW. The switch SW shown in FIG. 6 may be used as any one of the switches described above in FIGS. 5A-5D. In this embodiment, the switch SW is a stacked transistor switch. Accordingly, the switch SW includes a plurality of stacked transistors (wherein the stacked transistors as a group are referred to as element 382 and each stacked transistor is referred to individually as elements 382A-382G) formed on a common substrate. The stacked transistors 382A-382G in this disclosure may each be any type of transistor such as complementary metal-oxide-semiconductor field effect transistors (CMOS), a metal semiconductor field effect transistors (MESFETs), and a high electron mobility transistor field effect transistors (HFETs) and the like. In the illustrated embodiment, each of the stacked transistors 382A-382G is a field effect transistor (FET). Thus each of the stacked transistors 382A-382G includes a gate G, a source S, and a drain D formed within the substrate. A body contact B is also provided in each of the stacked transistors 382A-382G shown in FIG. 6. Each body contact B is coupled to a body of one of the stacked transistors 382A-382G.

It should be noted that a switch may be provided as a single transistor rather than as the plurality of stacked transistors 382. However, using the plurality of stacked transistors 382 allows the switch SW to have higher voltage handling capabilities while maintaining linearity. Each gate G is coupled to a conductive terminal 384, thereby receiving one of the switched impedance control signals. In this manner, the plurality of stacked transistors 382 can be switched on and off. Also, each gate G is coupled to the resistor 386 with a resistive value of RGCOMMON and one of the resistors 388, 390, 392, 394, 396, 398, 400 each with a resistive value of RG1. Each body contact B is coupled to one of the resistors 402, 404, 406, 408, 410, 412, 414 each with a resistive value of RB1 and coupled to a resistor 415 with a resistive value RBCOMMON. Each source S is coupled to a resistor 416, 418, 420, 422, 424, 426, 428 each having a resistive value RD1. The resistive values RGCOMMON, RB1, RBCOMMON and RD1 are selected to ameliorate the parasitic capacitance resulting from the plurality of stacked transistors 382.

In this embodiment, each body contact B is coupled to receive a body voltage from a conductive terminal 430. As such, the body contact B of each of the stacked transistors 382A-382G does not float but rather is set in accordance with the body voltage. The body voltage may be provided to be anywhere from 0 to −2.5 Volts. An input terminal of the switch SW is provided by a conductive terminal 432 and an output terminal of the switch SW is provided by a conductive terminal 434.

Figure 7A:
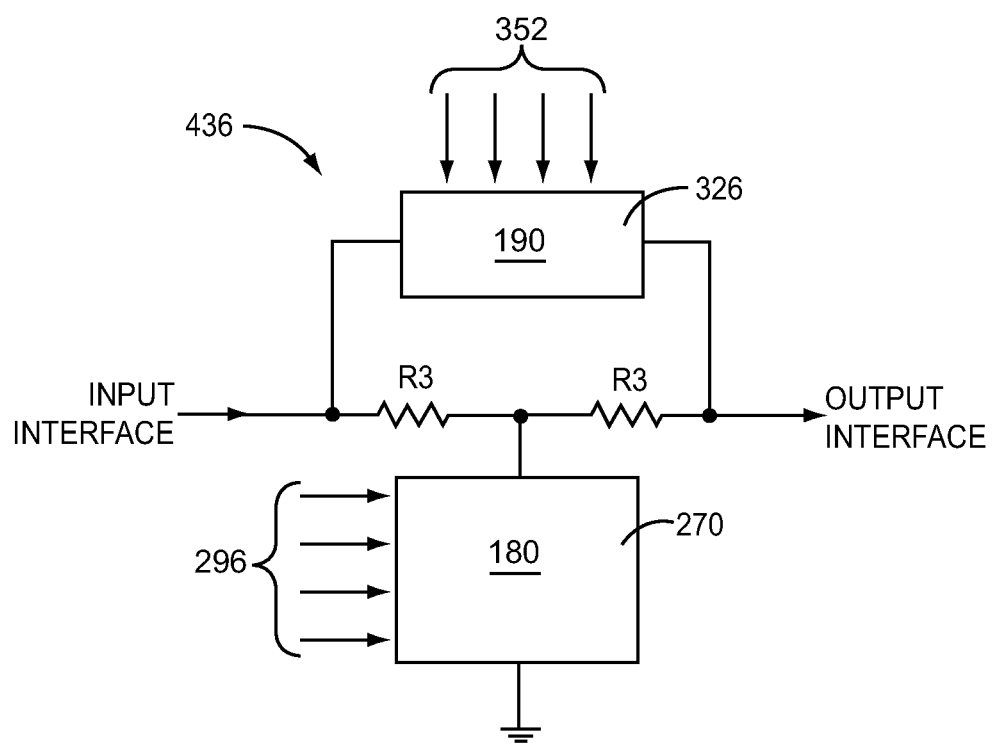
FIG. 7A illustrates one embodiment of a programmable thermometer encoded attenuator stage. The programmable thermometer encoded attenuator stage has a Bridged Tee Attenuator topology.

FIG. 7A illustrates one embodiment of a programmable thermometer encoded attenuator stage 436. The programmable thermometer encoded attenuator stage 436 may be used as one of the programmable thermometer encoded attenuator stages 100, 102, 104, 136, 138, 140, 152, 154, 156, 158 in FIGS. 3A-3E. As illustrated in FIG. 7A, the programmable thermometer encoded attenuator stage 436 has the Bridged Tee Attenuator topology 182 described above in FIG. 4A. The shunt impedance 180 is provided as the array of switched impedances 326 described above in FIG. 5C and the series impedance 190 is provided as the array of switched impedances 270 described above in FIG. 5A. As such, the array of switched impedances 326 receives the switched impedance control signals 352 and the array of switched impedances 270 receives the switched impedance control signals 296. For the purposes of explanation, it is presumed that the "N" number of switched impedances both in the array of switched impedances 326 and 270 illustrated in FIG. 7A is four (4). As a result, each of the switched impedance control signals 352 has a signal state that represents one bit in a four-bit thermometric code. Similarly, each of the switched impedance control signals 296 also has a signal state that represents one bit in a four-bit thermometric code. The four-bit thermometric code of the switched impedance control signals 352 may be the same as the four-bit thermometric code of the switched impedance control signals 296, or the thermometric codes may be inverted with respect to one another. For the purposes of explanation, it is presumed that the four-bit thermometric code of the switched impedance control signals 352 is inverted with respect to the four-bit thermometric code of the switched impedance control signals 296.

The programmable thermometer encoded attenuator stage 436 may thus be provided at five (i.e., N+1) discrete attenuation levels. For example, the programmable thermometer encoded attenuator stage 436 may be provided so as to provide the five discrete attenuation levels of 0 dB, 2 dB, 4 dB, 6 dB, 8 dB with an attenuation level step size of 2 dB. At the attenuation level of 0 dB, each of the switches SW1-SWN in the array of switched impedances 270 is open while each of the switches SW1-SWN in the array of switched impedances 326 is closed. This may be the configuration, for example, if the thermometric code is "0000" for the switched impedance control signals 352 and the thermometric code is "1111" for the switched impedance control signals 296.

However, once the thermometric code is "0001" for the switched impedance control signals 352 and the thermometric code is "1110" for the switched impedance control signals 296, the switch SW1 in the array of switched impedances 270 is closed and the switch SW1 in the array of switched impedances 352 is open. This results in the programmable thermometer encoded attenuator stage 436 having the discrete attenuation level of 2 dB.

Once the thermometric code is "0011" for the switched impedance control signals 352 and the thermometric code is "1100" for the switched impedance control signals 296, the switch SW2 in the array of switched impedances 270 is closed. Accordingly, the switches SW1, SW2 in the array of switched impedances 270 are closed as a result of the thermometric code "0011." Furthermore, the switch SW2 in the array of switched impedances 352 is open. Accordingly, the switches SW1, SW2 in the array of switched impedances 352 are open as a result of the thermometric code "1100." This results in the programmable thermometer encoded attenuator stage 436 having the discrete attenuation level of 4 dB.

Once the thermometric code is "0111" for the switched impedance control signals 352 and the thermometric code is "1000" for the switched impedance control signals 296, the switch SWN-1 in the array of switched impedances 270 is closed. Accordingly, the switches SW1, SW2, SWN-1 in the array of switched impedances 270 are closed as a result of the thermometric code "0111." Furthermore, the switch SWN-1 in the array of switched impedances 352 is open. Accordingly, the switches SW1, SW2, SWN-1 in the array of switched impedances 352 are open as a result of the thermometric code "1000." This results in the programmable thermometer encoded attenuator stage 436 having the discrete attenuation level of 6 dB.

Finally, once the thermometric code is "1111" for the switched impedance control signals 352 and the thermometric code is "0000" for the switched impedance control signals 296, the switch SWN in the array of switched impedances 270 is closed. Accordingly, the switches SW1, SW2, SWN-1, SWN in the array of switched impedances 270 are closed as a result of the thermometric code "1111." Furthermore, the switch SWN in the array of switched impedances 352 is open. Accordingly, the switches SW1, SW2, SWN-1, SWN in the array of switched impedances 352 are open as a result of the thermometric code "0000." This results in the programmable thermometer encoded attenuator stage 436 having the discrete attenuation level of 8 dB.

With regard to the programmable thermometer encoded attenuator stage 436 shown in FIG. 7A, Table II below illustrates another example of the thermometric code provided by the switched impedance control signals 296 and the switched impedance control signals 352 as a function of the a desired target attenuation. In this example, there the number N is five (5).

| Example of Thermometer Encoded Control of Bridged Tee attenuator (FIG. 7A) using array of switch resistors (FIG. 5A) & array of switched impedances (FIG. 5B) | | | | | | | | | | |
|---|---|---|---|---|---|---|---|---|---|---|
| Target attenuation | Switched Impedance Control Signals 296 to Array of Switched Impedances (FIG. 5B) | | | | | Control Signals #352 to array of switched Impedances (FIG. 5A) | | | | |
| dB | SW1 | SW2 | SW3 | SW4 | SW5 | SW1 | SW2 | SW3 | SW4 | SW5 |
| 0 | 1 | 0 | 0 | 0 | 0 | 1 | 1 | 1 | 1 | 1 |
| 2 | 1 | 1 | 0 | 0 | 0 | 0 | 1 | 1 | 1 | 1 |
| 4 | 1 | 1 | 1 | 0 | 0 | 0 | 0 | 1 | 1 | 1 |
| 6 | 1 | 1 | 1 | 1 | 0 | 0 | 0 | 0 | 1 | 1 |
| 8 | 1 | 1 | 1 | 1 | 1 | 0 | 0 | 0 | 0 | 1 |

Figure 7B:
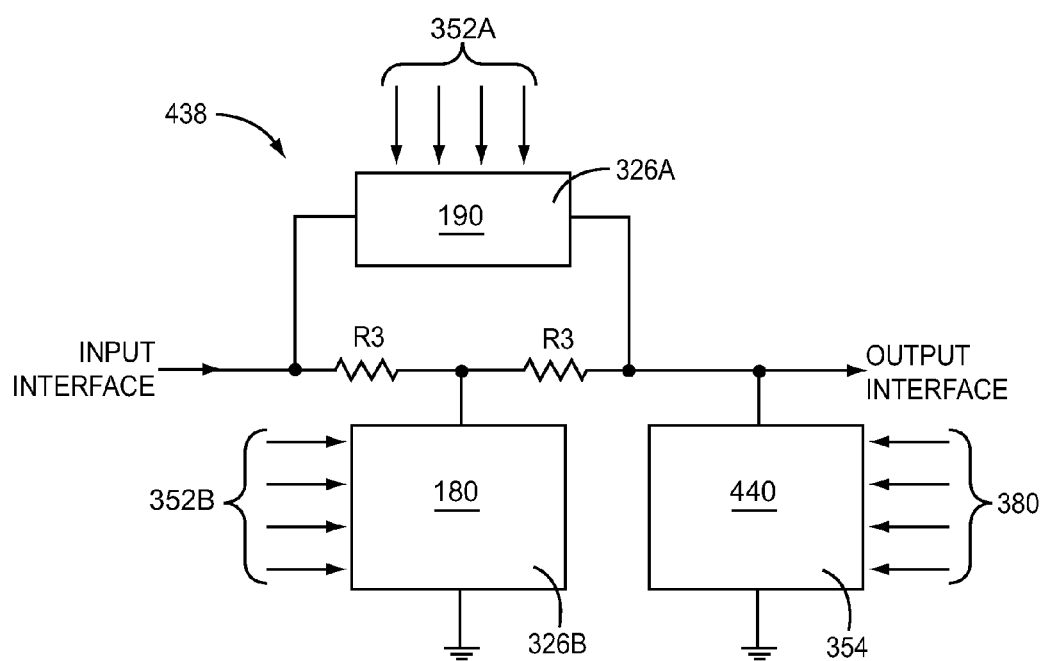
FIG. 7B illustrates another embodiment of a programmable thermometer encoded attenuator stage. The programmable thermometer encoded attenuator stage has is another embodiment of the Bridged Tee Attenuator topology with compensation circuitry on the output node to improve the high frequency step accuracy.

FIG. 7B illustrates another embodiment of a programmable thermometer encoded attenuator stage 438. The programmable thermometer encoded attenuator stage 438 may also be used as one of the programmable thermometer encoded attenuator stages 100, 102, 104, 136, 138, 140, 152, 154, 156, 158 in FIGS. 3A-3E. As illustrated in FIG. 7B, the programmable thermometer encoded attenuator stage 438 is another embodiment of the Bridged Tee Attenuator topology 182 described above in FIG. 4A. The shunt impedance 180 is provided as an array of switched impedances 326A. The array of switched impedances 326A has the same configuration as the array of switched impedances 326 described above in FIG. 5C. The series impedance 190 is provided as an array of switched impedances 326B. The array of switched impedances 326B has the same configuration as the array of switched impedances 326 described above in FIG. 5C. However, in this embodiment, an additional shunt impedance 440 is provided. The additional shunt impedance 440 has the array of switched impedances 354 described above in FIG. 5D.

As such, the array of switched impedances 326A receives switched impedance control signals 352A, the array of switched impedances 326A receives switched impedance control signals 352B and the array of switched impedances 270 receives the switched impedance control signals 380. For the purposes of explanation, it is presumed that the "N" number of switched impedances each of the arrays of switched impedances 326A, 326B, 354 illustrated in FIG. 7B is four (4). Accordingly, each of the switched impedance control signals 352A has a signal state that represents one bit in a four-bit thermometric code. Similarly, each of the switched impedance control signals 352B also has a signal state that represents one bit in a four-bit thermometric code. Finally, each of the switched impedance control signals 354 also has a signal state that represents one bit in a four-bit thermometric code.

In this embodiment, the four-bit thermometric code of the switched impedance control signals 352B is the same as the four-bit thermometric code of the switched impedance control signals 354. The four-bit thermometric code of the switched impedance control signals 352A is inverted with respect to four-bit thermometric code of the switched impedance control signals 352B and with respect to four-bit thermometric code of the switched impedance control signals 354.

The programmable thermometer encoded attenuator stage 438 may thus be provided at five (i.e., N+1) discrete attenuation levels. For example, the programmable thermometer encoded attenuator stage 438 may be provided so as to provide the five discrete attenuation levels of 0 dB, 0.2 dB, 0.4 dB, 0.6 dB, 0.8 dB with an attenuation level step size of 0.2 dB. Note that the array of switched impedances 326A and 326B only provide real impedance values. In contrast, the array of switched impedances 354 only provides capacitive impedance values. Accordingly, so as to provide matching, the array of switched impedances 354 is used for phase shifting while the switched impedances 326A and 326B are used to provide the appropriate real impedance values.

At the attenuation level of 0 dB, each of the switches SW1-SWN in the array of switched impedances 326B is open. Additionally, each of the switches SW1-SWN in the array of switched impedances 354 is open. In contrast, each of the switches SW1-SWN in the array of switched impedances 326A is closed. This may be the configuration, for example, if the thermometric code is "1111" for the switched impedance control signals 352A, the thermometric code is "0000" for the switched impedance control signals 352B, and the thermometric code is "0000" for the switched impedance control signals 380.

However, once the thermometric code is "1110" for the switched impedance control signals 352A, the thermometric code is "0001" for the switched impedance control signals 352B, and the thermometric code is "0001" for the switched impedance control signals 380, the switch SW1 in the array of switched impedances 326A is open, the switch SW1 in the array of switched impedances 326B is closed, and the switch SW1 in the array of switched impedances 354 is closed. This results in the programmable thermometer encoded attenuator stage 438 having the discrete attenuation level of 0.2 dB.

Once the thermometric code is "1100" for the switched impedance control signals 352A, the thermometric code is "0011" for the switched impedance control signals 352B, and the thermometric code is "0011" for the switched impedance control signals 380, the switch SW2 in the array of switched impedances 326A is open, the switch SW2 in the array of switched impedances 326B is closed, and the switch SW2 in the array of switched impedances 354 is closed. Accordingly, the switches SW1, SW2 in the array of switched impedances 326A are open as a result of the thermometric code "1100." The switches SW1, SW2 in the array of switched impedances 326B are open as a result of the thermometric code "0011." The switches SW1, SW2 in the array of switched impedances 354 are open as a result of the thermometric code "0011." This results in the programmable thermometer encoded attenuator stage 438 having the discrete attenuation level of 0.4 dB.

Once the thermometric code is "1000" for the switched impedance control signals 352A, the thermometric code is "0111" for the switched impedance control signals 352B, and the thermometric code is "0111" for the switched impedance control signals 380, the switch SWN-1 in the array of switched impedances 326A is open, the switch SWN-1 in the array of switched impedances 326B is closed, and the switch SWN-1 in the array of switched impedances 354 is closed. Accordingly, the switches SW1, SW2, SWN-1 in the array of switched impedances 326A are open as a result of the thermometric code "1000." The switches SW1, SW2, SWN-1 in the array of switched impedances 326B are open as a result of the thermometric code "0111." The switches SW1, SW2, SWN-1 in the array of switched impedances 354 are open as a result of the thermometric code "0111." This results in the programmable thermometer encoded attenuator stage 438 having the discrete attenuation level of 0.6 dB.

Finally, once the thermometric code is "0000" for the switched impedance control signals 352A, the thermometric code is "1111" for the switched impedance control signals 352B, and the thermometric code is "1111" for the switched impedance control signals 380, the switch SWN in the array of switched impedances 326A is open, the switch SWN in the array of switched impedances 326B is closed, and the switch SWN in the array of switched impedances 354 is closed. Accordingly, the switches SW1, SW2, SWN-1, SWN in the array of switched impedances 326A are open as a result of the thermometric code "0000." The switches SW1, SW2, SWN-1, SWN in the array of switched impedances 326B are open as a result of the thermometric code "1111." The switches SW1, SW2, SWN-1, SWN in the array of switched impedances 354 are open as a result of the thermometric code "1111." This results in the programmable thermometer encoded attenuator stage 438 having the discrete attenuation level of 0.8 dB.

Figure 8A:
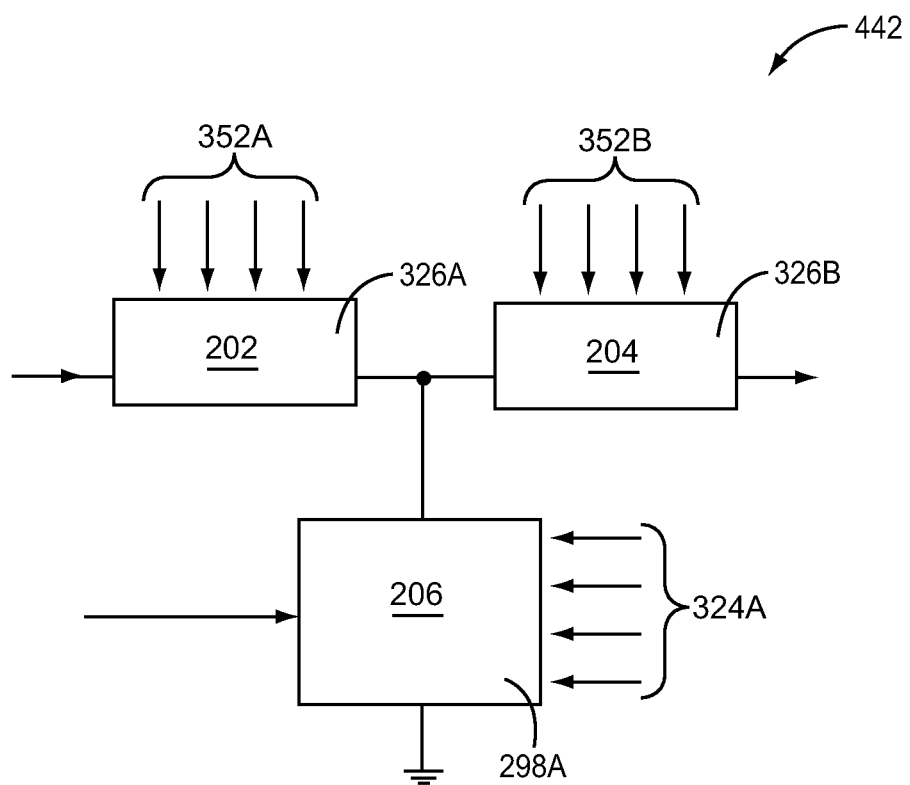
FIG. 8A illustrates another embodiment of a programmable thermometer encoded attenuator stage. The programmable thermometer encoded attenuator stage has a Tee Attenuator topology.

FIG. 8A illustrates another embodiment of a programmable thermometer encoded attenuator stage 442. The programmable thermometer encoded attenuator stage 442 may also be used as one of the programmable thermometer encoded attenuator stages 100, 102, 104, 136, 138, 140, 152, 154, 156, 158 in FIGS. 3A-3E. As illustrated in FIG. 8A, the programmable thermometer encoded attenuator stage 442 is an embodiment of the Tee Attenuator topology 196 described above in FIG. 4B. The shunt impedance 206 is provided as an array of switched impedances 298A. The array of switched impedances 298A has the same configuration as the array of switched impedances 298 described above in FIG. 5B. The series impedance 202 is provided as an array of switched impedances 326A. The array of switched impedances 326A has the same configuration as the array of switched impedances 326 described above in FIG. 5C. The series impedance 204 is provided as an array of switched impedances 326B. The array of switched impedances 326B has the same configuration as the array of switched impedances 326 described above in FIG. 5C.

As such, the array of switched impedances 326A receives switched impedance control signals 352A, the array of switched impedances 326B receives switched impedance control signals 352B and the array of switched impedances 298A receives the switched impedance control signals 298A. As in the embodiment described above in FIG. 7B, the series impedances 202 and 204 receive the same thermometric code, while the shunt impedance 206 receives an inverted thermometric code. As such, the switched impedance control signals 352A and the switched impedance control signals 352B provide the same thermometric code. The switched impedance control signals 298A are inverted with respect to the thermometric code provided by the switched impedance control signals 352A, 352B. Note that a universal thermometric code may be initially received by the programmable thermometer encoded attenuator stage 442 and provided as the thermometric code of both the series impedances 202 and 204. An array of inverters may also be provided to invert the universal thermometric code and generate the thermometric code for the shunt impedance 206.

At the lowest attenuation level, the switches SW1-SWN of both the series impedances 202 and 204 are all closed while the switches SW1-SWN in the shunt impedance 206 are all open. To increase the attenuation level by a discrete attenuation level step, a corresponding bit of the thermometric codes is changed. As a result, this opens one of the switches SW1-SWN in each of the series impedances 202 and 204 and closes one of the switches SW1-SWN in the shunt impedances. Accordingly, the attenuation level of the programmable thermometer encoded attenuator stage 442 is incremented by the discrete attenuation level step. To increment the attenuation level by an additional discrete attenuation level step, an additional bit of the thermometric codes is changed. In turn, this opens an additional one of the switches SW1-SWN in each of the series impedances 202 and 204 and closes an additional one of the switches SW1-SWN in the shunt impedances. As such, the attenuation level can be incremented by a total of N discrete attenuation level steps and thus the programmable thermometer encoded attenuator stage 442 may provide a total of N+1 discrete attenuation levels.

Figure 8B:
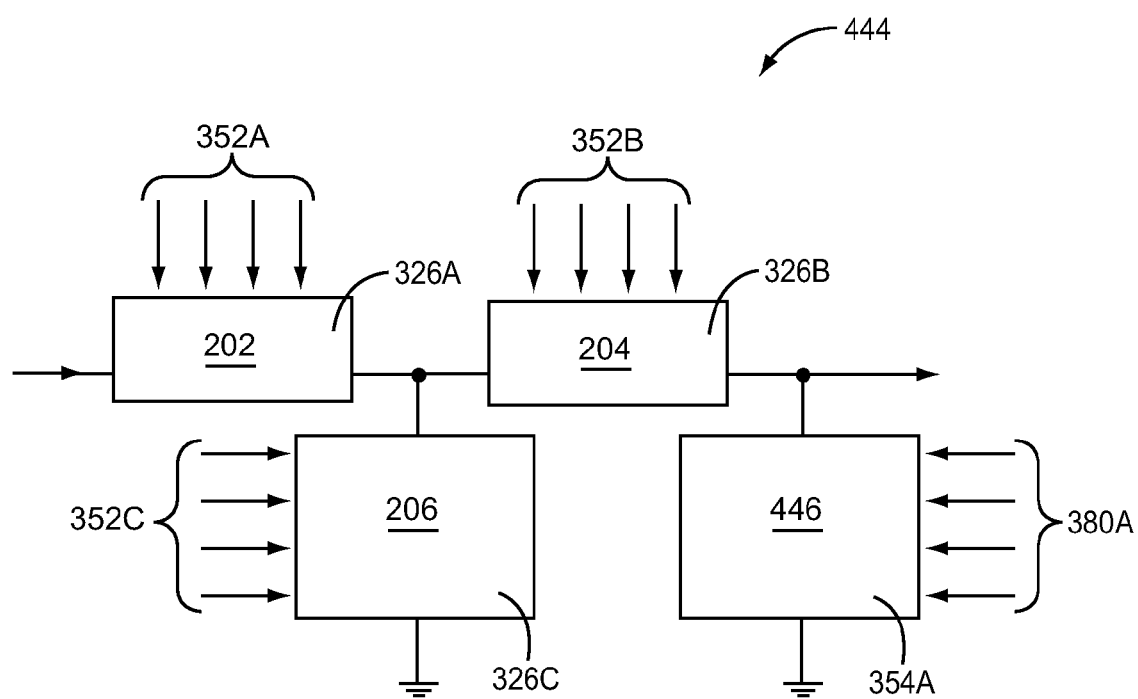
FIG. 8B illustrates another embodiment of a programmable thermometer encoded attenuator stage. The programmable thermometer encoded attenuator stage has another embodiment of the Tee Attenuator topology with compensation circuitry on the output node to improve the high frequency step accuracy.

FIG. 8B illustrates another embodiment of a programmable thermometer encoded attenuator stage 444. The programmable thermometer encoded attenuator stage 444 may also be used as one of the programmable thermometer encoded attenuator stages 100, 102, 104, 136, 138, 140, 152, 154, 156, 158 in FIGS. 3A-3E. As illustrated in FIG. 8B, the programmable thermometer encoded attenuator stage 444 is another embodiment of the Tee Attenuator topology 196 described above in FIG. 4B. In this embodiment, the series impedance 202 is provided as the array of switched impedances 326A. The array of switched impedances 326A has the same configuration as the array of switched impedances 326 described above in FIG. 5C. The series impedance 204 is provided as the array of switched impedances 326B. The array of switched impedances 326B has the same configuration as the array of switched impedances 326 described above in FIG. 5C. However, the shunt impedance 206 is provided as an array of switched impedances 326C. The array of switched impedances 326C has the same configuration as the array of switched impedances 326 described above in FIG. 5C. To provide phase shifting for matching, another shunt impedance 446 is provided. The shunt impedance 446 is provided as an array of switched impedances 354A. The array of switched impedances 354A has the same configuration as the array of switched impedances 354 in FIG. 5D.

As such, the array of switched impedances 326A receives the switched impedance control signals 352A and the array of switched impedances 326B receives switched impedance control signals 352B. The array of switched impedances 326C receives the switched impedance control signals 352C while the array of switched impedances receives switched impedance control signals 380A. As in the embodiment described above in FIG. 7B, the series impedances 202 and 204 receive the same thermometric code while the shunt impedance 206 and the shunts impedance 354 receive an inverted thermometric code. As such, the switched impedance control signals 352A and the switched impedance control signals 352B provide the same thermometric code. The switched impedance control signals 352C and the switched impedance control signals 380A are inverted with respect to the thermometric code provided by the switched impedance control signals 352A, 352B. Note that a universal thermometric code may be initially received to the programmable thermometer encoded attenuator stage 444 and provided as the thermometric code of both the shunt impedances 206, 446. An array of inverters may also be provided to invert the universal thermometric code and generate the thermometric code for the series impedances 202, 204.

At the lowest attenuation level, the switches SW1-SWN of both the series impedances 202 and 204 are all closed while the switches SW1-SWN in both the shunt impedances 206, 446 are all open. To increase the attenuation level by a discrete attenuation level step, a corresponding bit of the thermometric codes is changed. As a result, this opens one of the switches SW1-SWN in each of the series impedances 202 and 204 and closes one of the switches SW1-SWN each in the shunt impedances 206, 446. Accordingly, the attenuation level of the programmable thermometer encoded attenuator stage 444 is incremented by the discrete attenuation level step. To increment the attenuation level by an additional discrete attenuation level step, an additional bit of the thermometric codes is changed. In turn, this opens an additional one of the switches SW1-SWN in each of the series impedances 202 and 204 and closes an additional one of the switches SW1-SWN in the shunt impedances 206, 446. As such, the attenuation level can be incremented by a total of N discrete attenuation level steps and thus the programmable thermometer encoded attenuator stage 444 may provide a total of N+1 discrete attenuation levels.

Figure 9:
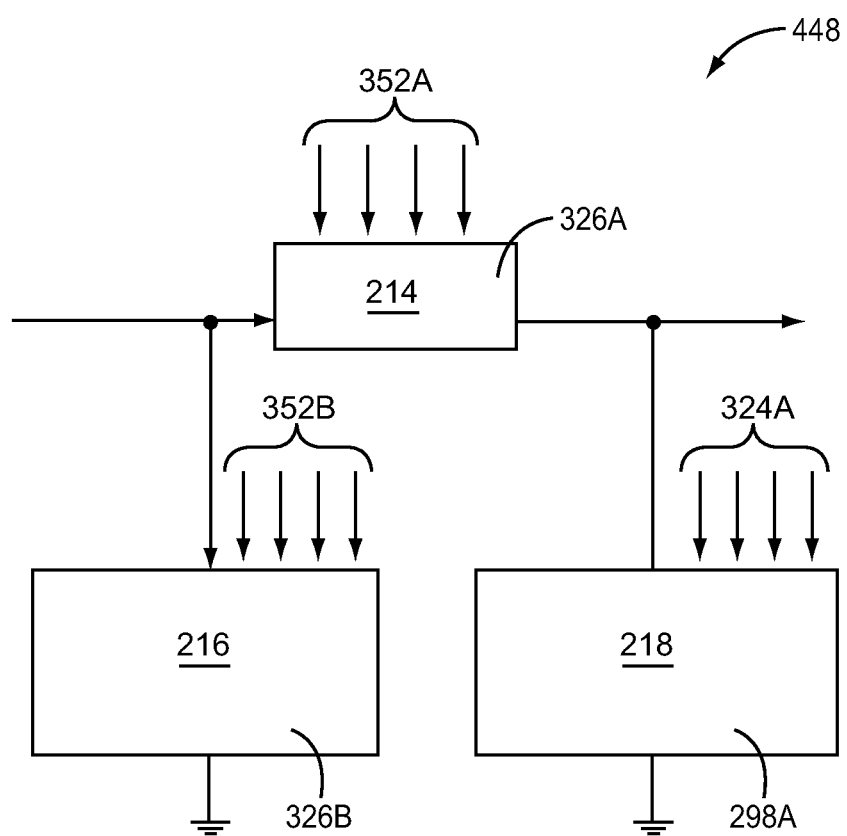
FIG. 9 illustrates another embodiment of a programmable thermometer encoded attenuator stage. The programmable thermometer encoded attenuator stage 448 has a Pi Attenuator topology.

FIG. 9 illustrates another embodiment of a programmable thermometer encoded attenuator stage 448. The programmable thermometer encoded attenuator stage 448 may also be used as one of the programmable thermometer encoded attenuator stages 100, 102, 104, 136, 138, 140, 152, 154, 156, 158 in FIGS. 3A-3E. As illustrated in FIG. 9, the programmable thermometer encoded attenuator stage 448 is an embodiment of the Pi Attenuator topology 208 described above in FIG. 4C. In this embodiment, the series impedance 214 is provided as the array of switched impedances 326A. The array of switched impedances 326A has the same configuration as the array of switched impedances 326 described above in FIG. 5C. The shunt impedance 216 is provided as the array of switched impedances 326B. The array of switched impedances 326B has the same configuration as the array of switched impedances 326 described above in FIG. 5C. The shunt impedance 218 is provided as an array of switched impedances 298A. The array of switched impedances 298A has the same configuration as the array of switched impedances 298 described above in FIG. 5B.

As such, the array of switched impedances 326A receives switched impedance control signals 352A and the array of switched impedances 326B receives switched impedance control signals 352B. The array of switched impedances 298A receives the switched impedance control signals 324A. As in the embodiment described above in FIG. 7B, the series impedance 214 receives a thermometric code while the shunt impedances 216, 218 receive an inverted thermometric code.

As such, the switched impedance control signals 352B, 298A are each inverted with respect to the switched impedance control signals 352A.

At the lowest attenuation level, the switches SW1-SWN of the series impedance 214 are all closed while the switches SW1-SWN in both the shunt impedances 216, 218 are all open. To increase the attenuation level by a discrete attenuation level step, a corresponding bit of the thermometric codes is changed. As a result, this opens one of the switches SW1-SWN in the series impedance 214 and closes one of the switches SW1-SWN each in the shunt impedances 216, 218. Accordingly, the attenuation level of the programmable thermometer encoded attenuator stage 448 is incremented by the discrete attenuation level step. To increment the attenuation level by an additional discrete attenuation level step, an additional bit of the thermometric codes is changed. In turn, this opens an additional one of the switches SW1-SWN in the series impedance 214 and closes an additional one of the switches SW1-SWN in each of the shunt impedances 216, 218. As such, the attenuation level can be incremented by a total of N discrete attenuation level steps and thus the programmable thermometer encoded attenuator stage 448 may provide a total of N+1 discrete attenuation levels.

Note that the programmable thermometer encoded attenuator stage 436, 438, 442, 444 and 448 in FIGS. 7A-9 are each for single-ended RF inputs.

Figure 10:
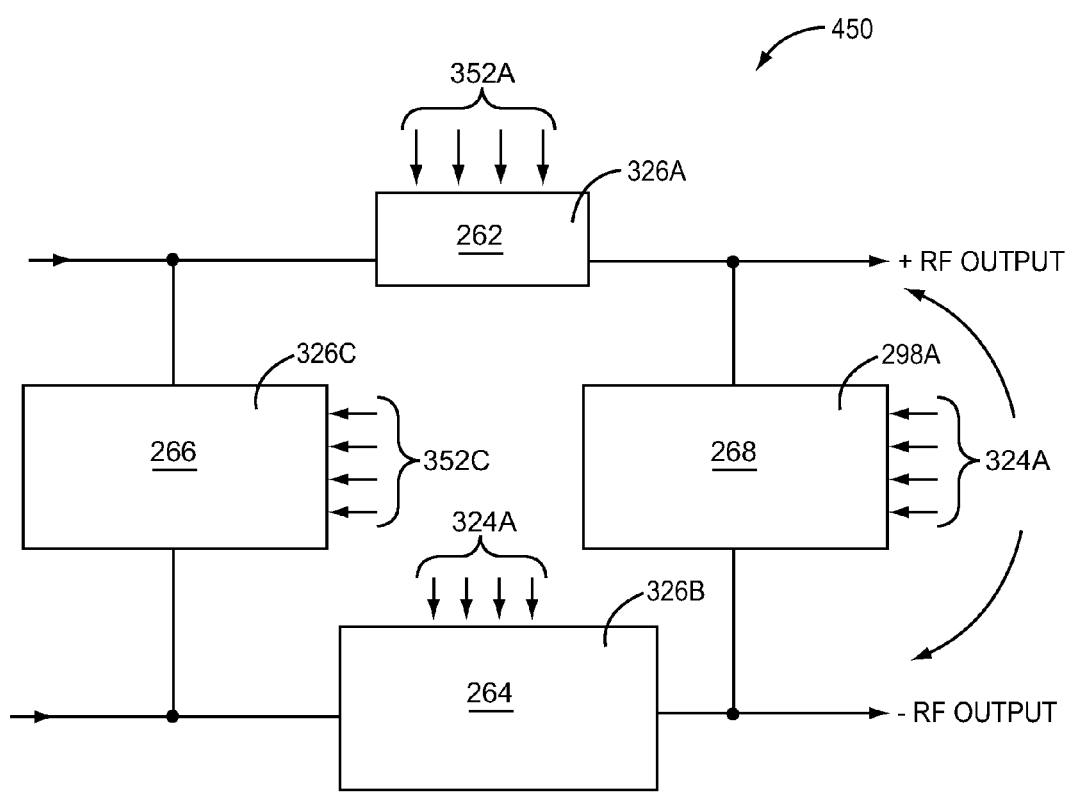
FIG. 10 illustrates an embodiment of a programmable thermometer encoded attenuator stage. The programmable thermometer encoded attenuator stage has an O-Attenuator topology.

FIG. 10 illustrates an embodiment of a programmable thermometer encoded attenuator stage 450. The programmable thermometer encoded attenuator stage 450 may also be used as one of the programmable thermometer encoded attenuator stages 100, 102, 104, 136, 138, 140, 152, 154, 156, 158 in FIGS. 3A-3E. As illustrated in FIG. 10, the programmable thermometer encoded attenuator stage 450 is an embodiment of the O-Attenuator topology 256 described above in FIG. 4F. In this embodiment, the series impedance 262 is provided as an array of switched impedances 326A. The array of switched impedances 326A has the same configuration as the array of switched impedances 326 described above in FIG. 5C. The series impedance 264 is provided as an array of switched impedances 326B. The array of switched impedances 326B has the same configuration as the array of switched impedances 326 described above in FIG. 5C. The shunt impedance 266 is provided as an array of switched impedances 326C. The array of switched impedances 326C has the same configuration as the array of switched impedances 326 described above in FIG. 5C. The shunt impedance 268 is provided as an array of switched impedances 298A. The array of switched impedances 298A has the same configuration as the array of switched impedances 298 described above in FIG. 5B.

As such, the array of switched impedances 326A receives switched impedance control signals 352A, the array of switched impedances 326B receives switched impedance control signals 352B, and the array of switched impedances 326C receives switched impedance control signals 352C. The array of switched impedances 298A receives switched impedance control signals 324A. As in the embodiment described above in FIG. 7B, the series impedances 262, 264 receive a thermometric code while the shunt impedances 266, 268 receive an inverted thermometric code. As such, the switched impedance control signals 352A, 352B are each inverted with respect to the switched impedance control signals 352C, 324A.

At the lowest attenuation level, the switches SW1-SWN of the series impedances 262, 264 are all closed while the switches SW1-SWN in both the shunt impedances 266, 268 are all open. To increase the attenuation level by a discrete attenuation level step, a corresponding bit of the thermometric codes is changed. As a result, this opens one of the switches SW1-SWN in each of the series impedances 262, 264 and closes one of the switches SW1-SWN each in the shunt impedances 266, 268. Accordingly, the attenuation level of the programmable thermometer encoded attenuator stage 450 is incremented by the discrete attenuation level step. To increment the attenuation level by an additional discrete attenuation level step, an additional bit of the thermometric codes is changed. In turn, this opens an additional one of the switches SW1-SWN in each of the series impedances 262, 264 and closes an additional one of the switches SW1-SWN in each of the shunt impedances 266, 268. As such, the attenuation level can be incremented by a total of N discrete attenuation level steps and thus the programmable thermometer encoded attenuator stage 450 may provide a total of N+1 discrete attenuation levels.

Figure 11:
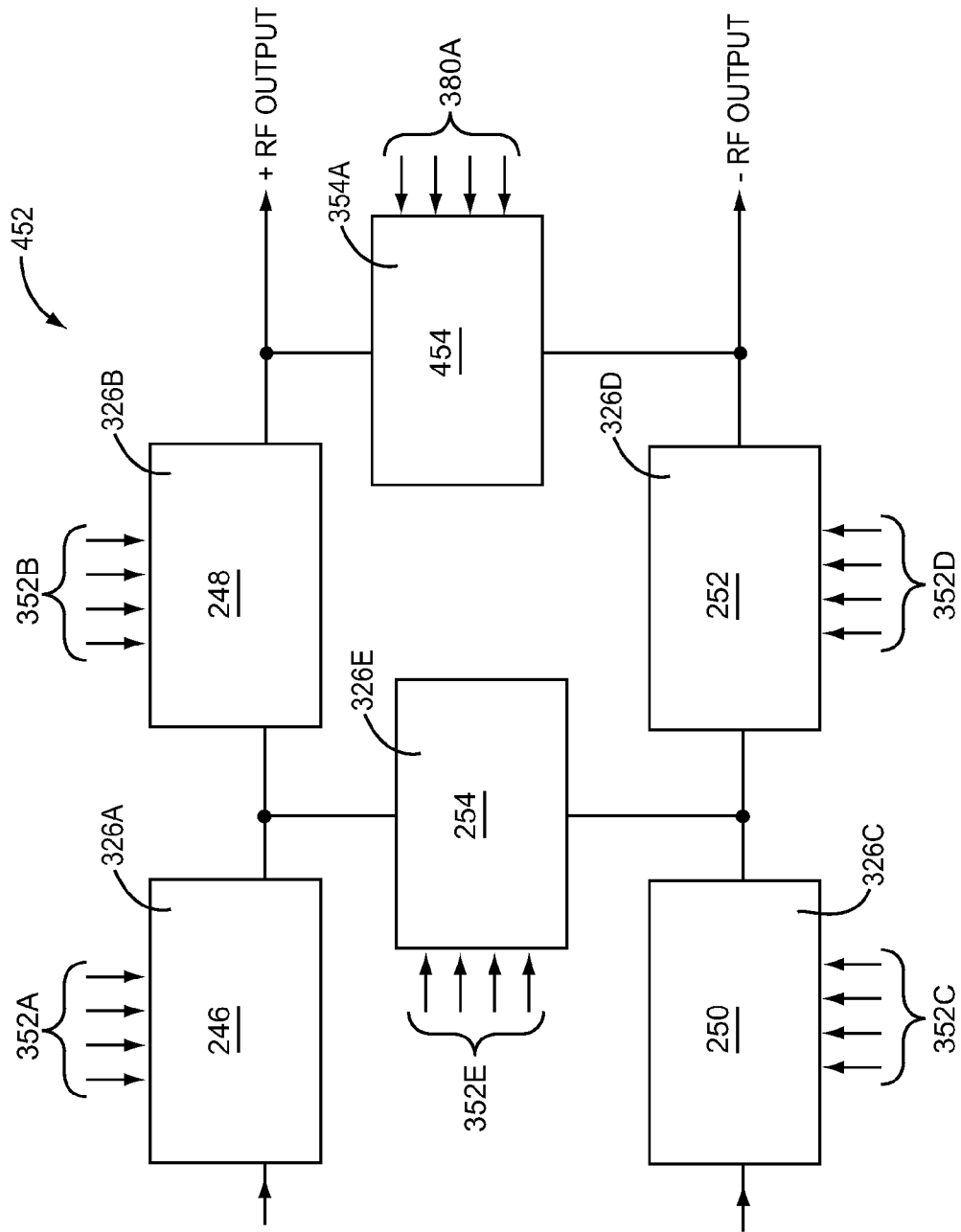
FIG. 11 illustrates an embodiment of a programmable thermometer encoded attenuator stage. The programmable thermometer encoded attenuator stage has an H-Attenuator topology with optional compensation circuitry on the output node to improve the high frequency step accuracy.

FIG. 11 illustrates an embodiment of a programmable thermometer encoded attenuator stage 452. The programmable thermometer encoded attenuator stage 452 may also be used as one of the programmable thermometer encoded attenuator stages 100, 102, 104, 136, 138, 140, 152, 154, 156, 158 in FIGS. 3A-3E. As illustrated in FIG. 11, the programmable thermometer encoded attenuator stage 452 is an embodiment of the H-Attenuator topology 240 described above in FIG. 4E. In this embodiment, the series impedance 246 is provided as an array of switched impedances 326A. The array of switched impedances 326A has the same configuration as the array of switched impedances 326 described above in FIG. 5C. The series impedance 248 is provided as an array of switched impedances 326B. The array of switched impedances 326B has the same configuration as the array of switched impedances 326 described above in FIG. 5C. The series impedance 250 is provided as an array of switched impedances 326C. The array of switched impedances 326C has the same configuration as the array of switched impedances 326 described above in FIG. 5C. The series impedance 252 is provided as an array of switched impedances 326D. The array of switched impedances 326D has the same configuration as the array of switched impedances 326 described above in FIG. 5C. The shunt impedance 254 is provided as an array of switched impedances 326E. The array of switched impedances 326E has the same configuration as the array of switched impedances 326 described above in FIG. 5C. So that the programmable thermometer encoded attenuator stage 452 can match, another shunt impedance 454 is provided. The shunt impedance 454 is provided as an array of switched impedances 354A. The array of switched impedances 354A has the same configuration as the array of switched impedances 354 described above in FIG. 5D.

As such, the array of switched impedances 326A receives switched impedance control signals 352A, the array of switched impedances 326B receives switched impedance control signals 352B, the array of switched impedances 326C receives switched impedance control signals 352C, the array of switched impedances 326D receives switched impedance control signals 352D, and the array of switched impedances 326E receives switched impedance control signals 352E. The array of switched impedances 454 receives switched impedance control signals 380A. As in the embodiment described above in FIG. 7B, the series impedances 246, 248, 250, 252 receive a thermometric code while the shunt impedances 254, 454 receive an inverted thermometric code. As such, the switched impedance control signals 352A-352D are each inverted with respect to the and the switched impedance control signals 352E, 380A.

At the lowest attenuation level, the switches SW1-SWN of the series impedances 246, 248, 250, 252 are all closed while the switches SW1-SWN in both the shunt impedances 254, 454 are all open. To increase the attenuation level by a discrete attenuation level step, a corresponding bit of the thermometric codes is changed. As a result, this opens one of the switches SW1-SWN in each of the series impedances 246, 248, 250, 252 and closes one of the switches SW1-SWN each in the shunt impedances 254, 454. Accordingly, the attenuation level of the programmable thermometer encoded attenuator stage 452 is incremented by the discrete attenuation level step. To increment the attenuation level by an additional discrete attenuation level step, an additional bit of the thermometric codes is changed. In turn, this opens an additional one of the switches SW1-SWN in each of the series impedances 246, 248, 250, 252 and closes an additional one of the switches SW1-SWN in each of the shunt impedances 254, 454. As such, the attenuation level can be incremented by a total of N discrete attenuation level steps, and thus the programmable thermometer encoded attenuator stage 452 may provide a total of N+1 discrete attenuation levels.

Figure 12A:
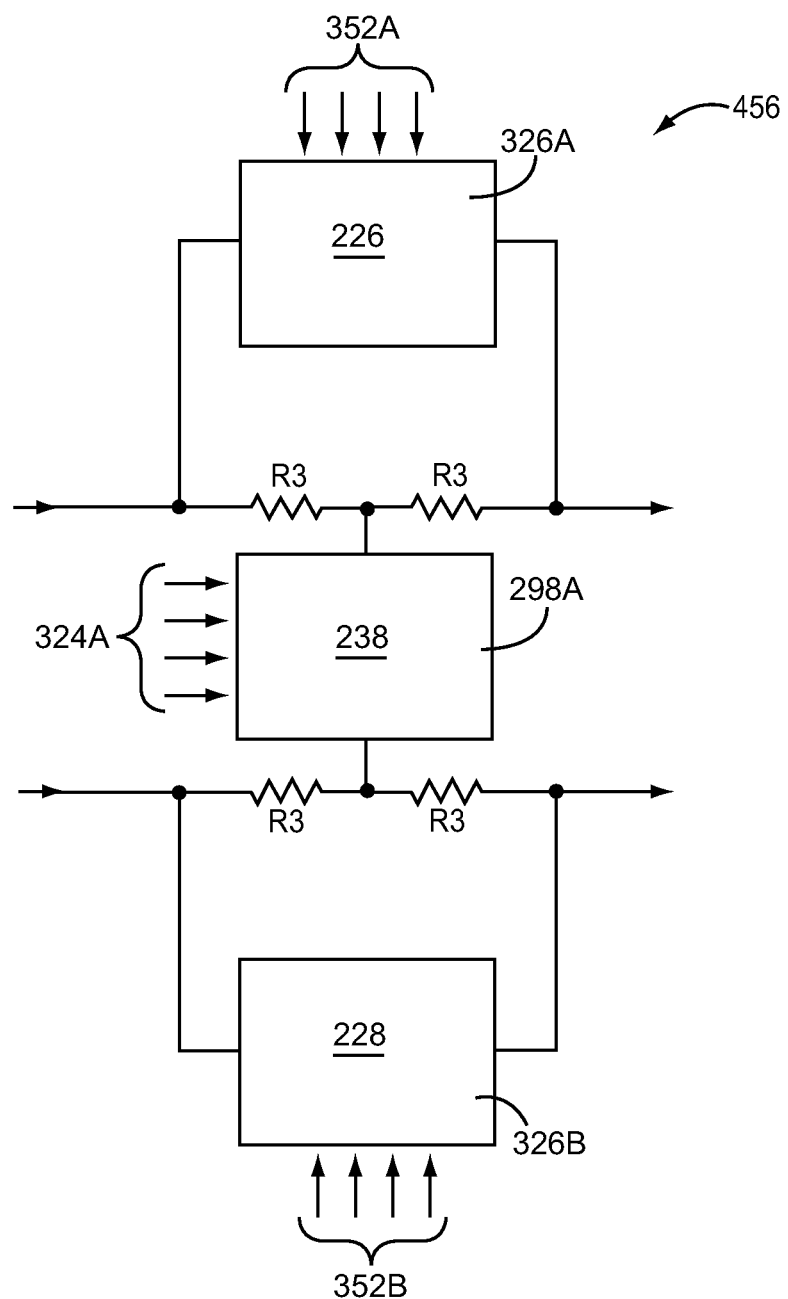
FIG. 12A illustrates an embodiment of a programmable thermometer encoded attenuator stage. The programmable thermometer encoded attenuator stage has a Bridged H-Attenuator topology.

FIG. 12A illustrates an embodiment of a programmable thermometer encoded attenuator stage 456. The programmable thermometer encoded attenuator stage 456 may also be used as one of the programmable thermometer encoded attenuator stages 100, 102, 104, 136, 138, 140, 152, 154, 156, 158 in FIGS. 3A-3E. As illustrated in FIG. 12A, the programmable thermometer encoded attenuator stage 456 is an embodiment of the Bridged H-Attenuator topology 220 described above in FIG. 4D. In this embodiment, the series impedance 226 is provided as an array of switched impedances 326A. The array of switched impedances 326A has the same configuration as the array of switched impedances 326 described above in FIG. 5C. The series impedance 228 is provided as an array of switched impedances 326B. The array of switched impedances 326B has the same configuration as the array of switched impedances 326 described above in FIG. 5C. The shunt impedance 238 is provided as an array of switched impedances 298A. The array of switched impedances 298A has the same configuration as the array of switched impedances 298 described above in FIG. 5B.

As such, the array of switched impedances 326A receives switched impedance control signals 352A and the array of switched impedances 326B receives switched impedance control signals 352B. The array of switched impedances 298A receives switched impedance control signals 324A. As in the embodiment described above in FIG. 7B, the series impedances 226, 228 receive a thermometric code while the shunt impedance 238 receives an inverted thermometric code. As such, the switched impedance control signals 352A-352B each are inverted with respect to the switched impedance control signals 324A.

At the lowest attenuation level, the switches SW1-SWN of the series impedances 226, 228 are all closed while the switches SW1-SWN in the shunt impedance 238 are all open. To increase the attenuation level by a discrete attenuation level step, a corresponding bit of the thermometric codes is changed. As a result, this opens one of the switches SW1-SWN in each of the series impedances 226, 228 and closes one of the switches SW1-SWN in the shunt impedance 238. Accordingly, the attenuation level of the programmable thermometer encoded attenuator stage 456 is incremented by the discrete attenuation level step. To increment the attenuation level by an additional discrete attenuation level step, an additional bit of the thermometric codes is changed. In turn, this opens an additional one of the switches SW1-SWN in each of the series impedances 226, 228 and closes an additional one of the switches SW1-SWN in the shunt impedances 238. As such, the attenuation level can be incremented by a total of N discrete attenuation level steps, and thus the programmable thermometer encoded attenuator stage 456 may provide a total of N+1 discrete attenuation levels.

Figure 12B:
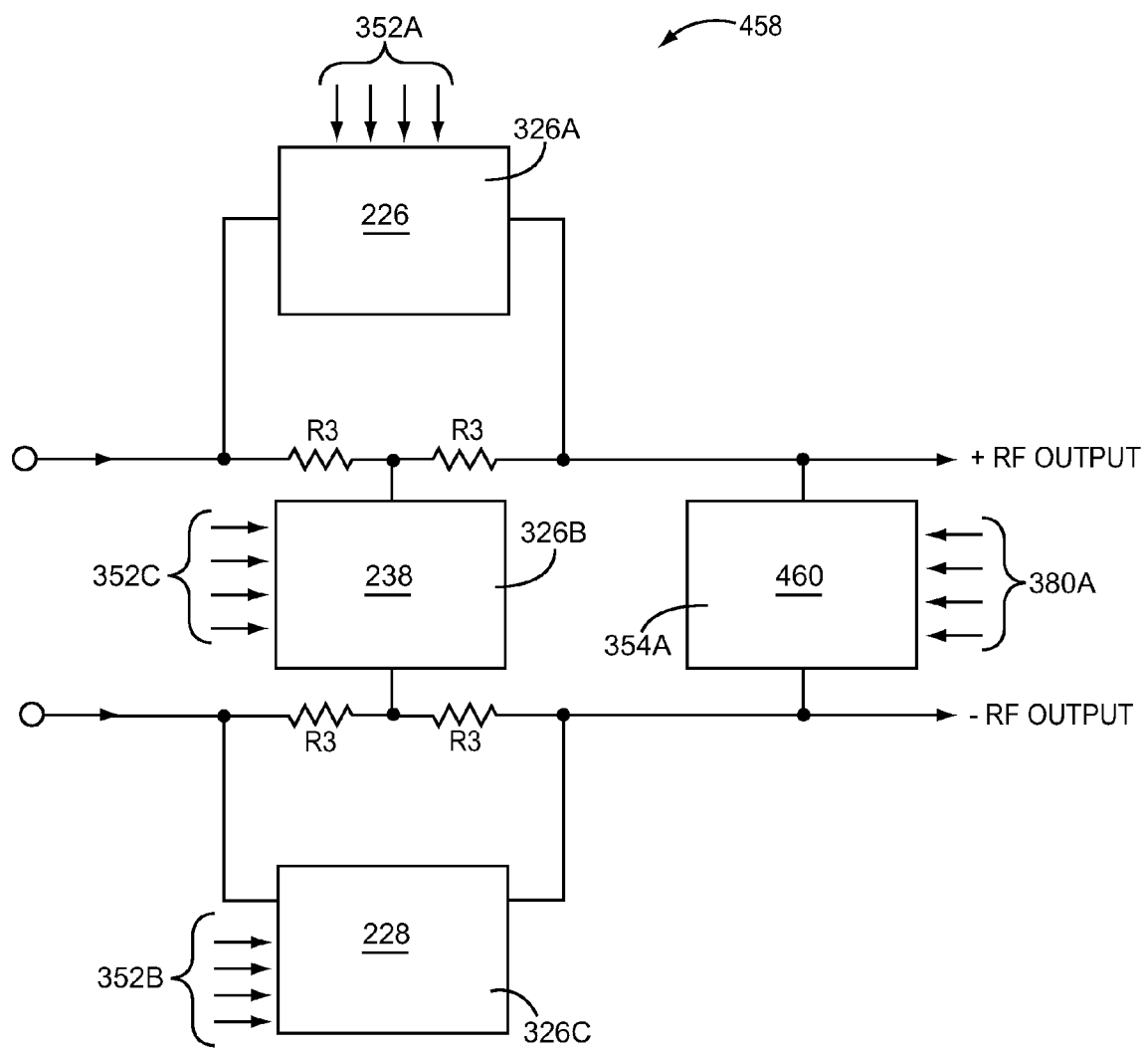
FIG. 12B illustrates an embodiment of a programmable thermometer encoded attenuator stage. The programmable thermometer encoded attenuator stage has another embodiment of the H-Attenuator topology with compensation circuitry on the output node to improve the high frequency step accuracy.

FIG. 12B illustrates an embodiment of a programmable thermometer encoded attenuator stage 458. The programmable thermometer encoded attenuator stage 458 may also be used as one of the programmable thermometer encoded attenuator stages 100, 102, 104, 136, 138, 140, 152, 154, 156, 158 in FIGS. 3A-3E. As illustrated in FIG. 12B, the programmable thermometer encoded attenuator stage 458 is another embodiment of the H-Attenuator topology 240 described above in FIG. 4E. In this embodiment, the series impedance 226 is provided as an array of switched impedances 326A. The array of switched impedances 326A has the same configuration as the array of switched impedances 326 described above in FIG. 5C. The series impedance 228 is provided as an array of switched impedances 326B. The array of switched impedances 326B has the same configuration as the array of switched impedances 326 described above in FIG. 5C. The shunt impedance 238 is provided as an array of switched impedances 326C. The array of switched impedances 326C has the same configuration as the array of switched impedances 326 described above in FIG. 5C. So that the programmable thermometer encoded attenuator stage 458 can match, a shunt impedance 460 is provided as an array of switched impedances 354A. The array of switched impedances 354A has the same configuration as the array of switched impedances 354 described above in FIG. 5D.

As such, the array of switched impedances 326A receives switched impedance control signals 352A, the array of switched impedances 326B receives switched impedance control signals 352B, and the array of switched impedances 326C receives switched impedance control signals 352C. The array of switched impedances 460 receives switched impedance control signals 380A. As in the embodiment described above in FIG. 7B, the series impedances 226, 228 receive a thermometric code while the shunt impedances 238, 460 receive an inverted thermometric code. As such, the switched impedance control signals 352A, 352B are each inverted with respect to the switched impedance control signals 352C, 380A.

At the lowest attenuation level, the switches SW1-SWN of the series impedances 226, 228 are all closed while the switches SW1-SWN in both the shunt impedances 238, 460 are all open. To increase the attenuation level by a discrete attenuation level step, a corresponding bit of the thermometric codes is changed. As a result, this opens one of the switches SW1-SWN in each of the series impedances 226, 228 and closes one of the switches SW1-SWN each in the shunt impedances 238, 460. Accordingly, the attenuation level of the programmable thermometer encoded attenuator stage 458 is incremented by the discrete attenuation level step. To increment the attenuation level by an additional discrete attenuation level step, an additional bit of the thermometric codes is changed. In turn, this opens an additional one of the switches SW1-SWN in each of the series impedances 226, 228 and closes an additional one of the switches SW1-SWN in each of the shunt impedances 238, 460. As such, the attenuation level can be incremented by a total of N discrete attenuation level steps, and thus the programmable thermometer encoded attenuator stage 458 may provide a total of N+1 discrete attenuation levels.

Figure 13:
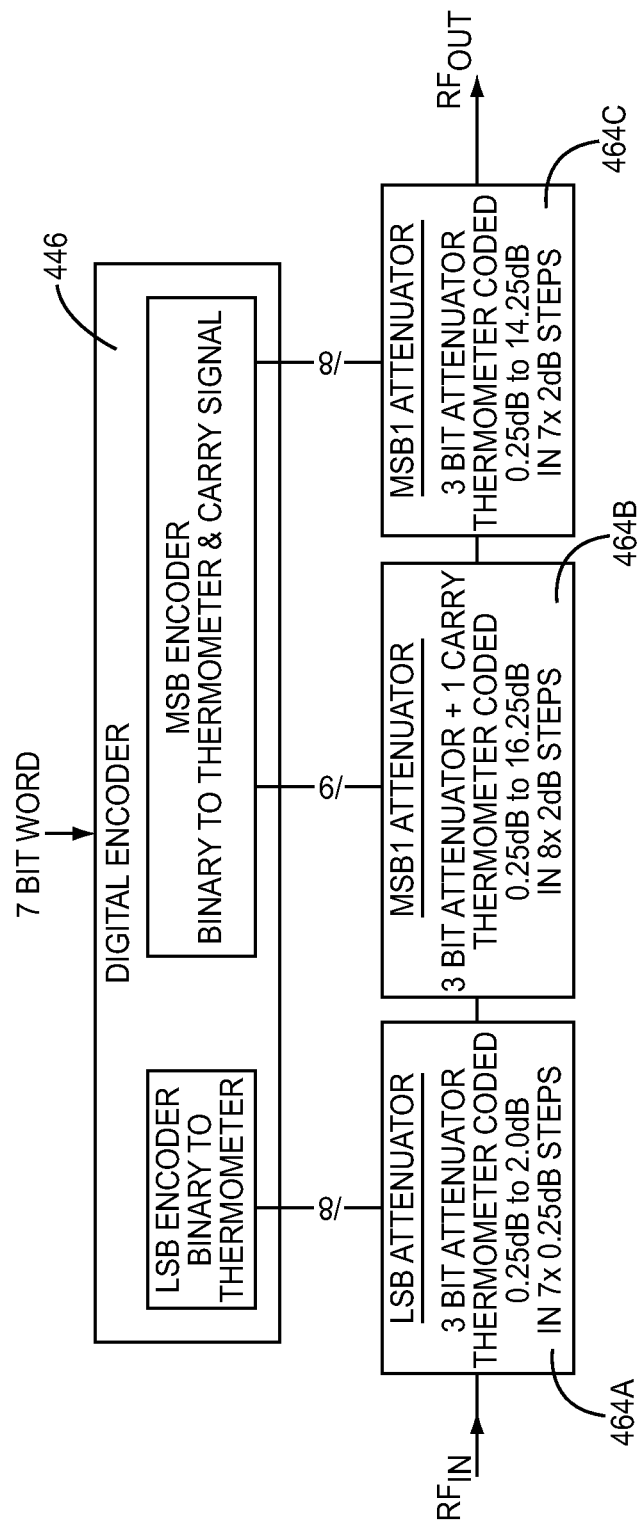
FIG. 13 illustrates another embodiment of a digital step attenuator formed on a semiconductor substrate.

FIG. 13 another embodiment of a digital step attenuator 462 formed on a semiconductor substrate. The digital step attenuator 462 has a segmented design using multi-level attenuation stages (referred to generically as element 464 and specifically as elements 464A-464C) together with thermometric code.

In this embodiment, a control circuit 466 of the digital step attenuator 462 receives a 7 bit binary word 468. The digital step attenuator 462 has a 0.75 dB to 32.75 dB attenuation range with a discrete attenuation level step of 0.25 dB. The digital step attenuator 462 includes a LSB attenuator stage 464A with an attenuation range of 0.25 dB to 2 dB and a discrete attenuation level step of 0.25 dB. The LSB attenuator stage 464A is cascaded with a first MSB attenuator stage 464B and a second MSB attenuator 464C. The first MSB attenuator stage 464B has an attenuation range of 0.25 dB to 16.25 dB with a discrete attenuation level step of 2 dB. It also can deal with a 2 dB "carry" that is required because of the use of thermometer encoding. The second MSB attenuator stage 464C has an attenuation range of 2.25 dB to 14.25 dB with a 2 dB step size. Note that the 0.25 dB offset in both the LSB and MSB attenuators stages 464A-464C is included to represent the minimum insertion loss.

The digital step attenuator 462 has three principle advantages over the classical binary weighted DSA architecture. First there are only 3 cascaded stages in the 7 bit DSA. This should translate into a significantly lower insertion loss or alternatively a wider operating bandwidth. As described above, a 0.75 dB IL minimum insertion loss is provided versus 1.75 dB for traditional 7 bit binary weighted designs assuming 0.25 dB insertion loss per cascaded stage. Second, MSB attenuators stages 464A-464C are thermometer encoded which means that gain step accuracy is achievable. Finally, the configuration is monotonic by design. DNL is largely defined by matching of the LSB attenuator stage 464A to that of the MSB attenuator stages 464B, 464C. Extra resolution can be added by increasing the segmentation within the LSB attenuator to give a 0.125 dB or 0.06125 dB LSB. The use of thermometer encoding means the finer gain step accuracy should be easier to obtain. This extra resolution can be obtained with little to no impact on the minimum insertion loss.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art would also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the specific examples and designs, but is to be accorded the widest scope consistent with the disclosed principles and features described herein.

What is claimed is:

1. A digital step attenuator comprising:
   a input interface;
   a output interface;
   control interface configured to receive a codeword; and
   programmable thermometer encoded attenuator stages arranged in a cascade of programmable thermometer encoded attenuator stages including:
      a first thermometer encoded attenuator stage having a first attenuation step size;
      a second thermometer encoded attenuator stage having a second attenuation step size that is smaller than the first attenuation step size; and
      each of the first programmable thermometer encoded attenuator stage and the second programmable thermometer encoded attenuator stage is configured to respectively provide an attenuation level as a function of the codeword to cooperatively generate a plurality of thermometer encoded attenuation levels between the input interface and the output interface.

2. The digital step attenuator of claim 1 wherein the second thermometer encoded attenuator stage has a maximum attenuation level substantially equal to the first attenuation step size.

3. The digital step attenuator of claim 2 wherein the second attenuation step size is substantially equal to one of 1/16 dB, 1/8 dB, and 1/4 dB.

4. The digital step attenuator of claim 3 wherein the first attenuation step size is substantially equal to 2 dB.

5. The digital step attenuator of claim 2 further comprising a control circuit configured to respectively control the attenuation level of each of the programmable thermometer encoded attenuator stages to generate the plurality of thermometer encoded attenuation levels between the input interface and the output interface as the function of the codeword.

6. The digital step attenuator of claim 2 further comprising a control circuit configured to:
   convert the codeword into thermometer encoded codewords; and
   provide each of the programmable thermometer encoded attenuator stages with a respective one of the thermometer encoded codewords; and
   govern the attenuation level of each of the programmable thermometer encoded attenuator stages based on the respective one of the thermometer encoded codewords.

7. The digital step attenuator of claim 6 wherein the control circuit is further configured to generate the thermometer encoded codewords as the function of the codeword, the first attenuation step size and the second attenuation step size.

8. The digital step attenuator of claim 7 wherein the codeword is a binary codeword.

9. The digital step attenuator of claim 7 wherein:
   the first thermometer encoded attenuator stage is a first large step thermometer encoded attenuator stage; and
   the programmable thermometer encoded attenuator stages further include large step thermometer encoded attenuator stages including:
      the first large step thermometer encoded attenuator stage; and
      a second large step thermometer encoded attenuator stage having a third attenuation step size substantially equal to the first attenuation step size.

10. The digital step attenuator of claim 9 wherein the cascade of programmable thermometer encoded attenuator stages further comprises:
cascade positions arranged with respect to the input interface, and each of the programmable thermometer encoded attenuator stages has a cascade position of the cascade positions; and
wherein:
the control circuit is further configured to generate the thermometer encoded codewords as the function of the codeword, the attenuation step sizes of the programmable thermometer encoded attenuator stages, and the cascade position of each of the each of the large step thermometer encoded attenuator stages.

11. The digital step attenuator of claim 10 wherein:
a sum of the attenuation level provided by each of the large step thermometer encoded attenuator stages is a gross attenuation level; and
the control circuit is further configured to monotonically increase the attenuation level provided by each of the large step thermometer encoded attenuator stages in cascade order to increase the gross attenuation level.

12. The digital step attenuator of claim 11 wherein the control circuit is further configured to monotonically decrease the attenuation level provided by each of the large step thermometer encoded attenuator stages in inverse cascade order to reduce the gross attenuation level.

13. The digital step attenuator of claim 12 wherein the cascade position of the first large step thermometer encoded attenuator stage is a first cascade position of the cascade of programmable thermometer encoded attenuator stages.

14. The digital step attenuator of claim 13 wherein the cascade position of the second large step thermometer encoded attenuator stage is a second cascade position of the cascade of programmable thermometer encoded attenuator stages.

15. The digital step attenuator of claim 14 wherein the cascade of programmable thermometer encoded attenuator stages further comprises a third large step thermometer encoded attenuator stage having a fourth attenuation step size substantially equal to the first attenuation step size.

16. The digital step attenuator of claim 13 wherein the cascade position of the second thermometer encoded attenuator stage is a second cascade position of the cascade of programmable thermometer encoded attenuator stages.

17. The digital step attenuator of claim 16 wherein the cascade position of the second large step thermometer encoded attenuator stage is a third cascade position of the cascade of programmable thermometer encoded attenuator stages.

18. The digital step attenuator of claim 17 wherein the large step thermometer encoded attenuator stages further include a third large step thermometer encoded attenuator stage having a fifth attenuation step size substantially equal to the first attenuation step size, and wherein the cascade position of the third large step thermometer encoded attenuator stage is a fourth cascade position of the cascade of programmable thermometer encoded attenuator stages.

19. The digital step attenuator of claim 17 wherein the first attenuation step size is substantially equal to 2 dB.

20. The digital step attenuator of claim 19 wherein the second attenuation step size is substantially equal to one of $1/16$ dB, $1/8$ dB, and $1/4$ dB.

21. The digital step attenuator of claim 10 wherein:
each of the programmable thermometer encoded attenuator stages includes a respective attenuation range; and
the control circuit is further configured to adjust the attenuation level over the respective attenuation range of each of the large step thermometer encoded attenuator stages based on cascade order.

22. The digital step attenuator of claim 21 wherein:
a sum of the attenuation level of each of the large step thermometer encoded attenuator stages is a gross attenuation level;
the control circuit is configured to reduce the gross attenuation level by reducing the attenuation level of the each of the large step thermometer encoded attenuator stages based on inverse cascade order such that the attenuation level of the one of the large step thermometer encoded attenuator stages that is nearest the input interface is reduced after the attenuation level of each of the large step thermometer encoded attenuator stages that are further away from the input interface is substantially equal to a minimum attenuation level.

23. The digital step attenuator of claim 21 wherein:
a sum of the attenuation level provided by each of the large step thermometer encoded attenuator stages is a gross attenuation level;
the control circuit is configured to increase the gross attenuation level by increasing the attenuation level of the each of the large step thermometer encoded attenuator stages based on cascade order such that the attenuation level of the one of the large step thermometer encoded attenuator stages that is furthest from the input interface is increased after the attenuation level of each of the large step thermometer encoded attenuator stages that are nearer to the input interface is substantially equal to a maximum attenuation level.

24. The digital step attenuator of claim 1 wherein:
the cascade of programmable thermometer encoded attenuator stages further includes cascade positions including a first cascade position that is located nearest the input interface, a second cascade position, and a third cascade position; and
the first thermometer encoded attenuator stage is in the first cascade position.

25. The digital step attenuator of claim 24 wherein one thermometer encoded attenuator stage is a first large step thermometer encoded attenuator stage, and the cascade of programmable thermometer encoded attenuator stages further comprises:
large step thermometer encoded attenuator stages including:
the first large step thermometer encoded attenuator stage; and
a second large step thermometer encoded attenuator stage including a third attenuation step size substantially equal to the first attenuation step size, and configured to provide the attenuation level as the function of the codeword to cooperatively generate the plurality of thermometer encoded attenuation levels in combination with the first large step thermometer encoded attenuator stage and the second thermometer encoded attenuator stage.

26. The digital step attenuator of claim 25 wherein the second thermometer encoded attenuator stage has a maximum operational attenuation level that is substantially equal to the first attenuation step size.

27. The digital step attenuator of claim 26 wherein the large step thermometer encoded attenuator stages each have an insertion loss that is substantially equal to an insertion loss of the second thermometer encoded attenuator stage.

28. The digital step attenuator of claim 27 wherein the insertion loss between the input interface and the output interface is substantially equal to no more than about 1 dB.

29. The digital step attenuator of claim 27 wherein the second thermometer encoded attenuator stage has a second maximum operational attenuation level substantially equal to 2 dB.

30. The digital step attenuator of claim 29 wherein the second attenuation step size is substantially equal to one of 1/16 dB, 1/8 dB, and 1/4 dB.

31. The digital step attenuator of claim 27 wherein the insertion loss of the second thermometer encoded attenuator stage is substantially equal to the second attenuation step size.

32. The digital step attenuator of claim 26 wherein the second thermometer encoded attenuator stage is in the second cascade position.

33. The digital step attenuator of claim 26 wherein:
the large step thermometer encoded attenuator stages further include a third large step thermometer encoded attenuator stage including a fourth attenuation step size substantially equal to the first attenuation step size, and configured to provide the attenuation level as the function of the codeword to cooperatively generate the plurality of thermometer encoded attenuation levels in combination with the first large step thermometer encoded attenuator stage, the second large step thermometer encoded attenuator stage and the second thermometer encoded attenuator stage; and
cascade positions further include a fourth cascade position located nearest the output interface.

34. The digital step attenuator of claim 33 wherein the second thermometer encoded attenuator stage is in the second cascade position.

35. The digital step attenuator of claim 33 wherein the second large step thermometer encoded attenuator stage is in the third cascade position.

36. The digital step attenuator of claim 35 wherein the second thermometer encoded attenuator stage is in the second cascade position.

37. The digital step attenuator of claim 1 wherein the first thermometer encoded attenuator stage is configured as one of a Pi attenuator, a Tee attenuator, and a Bridged Tee attenuator.

38. The digital step attenuator of claim 1 wherein the second thermometer encoded attenuator stage is configured as one of a Pi attenuator, a Tee attenuator, and a Bridged Tee attenuator.

39. The digital step attenuator of claim 1 wherein the first thermometer encoded attenuator stage and the second thermometer encoded attenuator stage are one of a Pi attenuator, a Tee attenuator, and a Bridged Tee attenuator.

40. The digital step attenuator of claim 39 wherein the first thermometer encoded attenuator stage and the second thermometer encoded attenuator stage each have a same attenuator topology.

* * * * *